(12) United States Patent
Kamimura

(10) Patent No.: US 11,465,073 B2
(45) Date of Patent: Oct. 11, 2022

(54) CHEMICAL LIQUID PURIFICATION METHOD, CHEMICAL LIQUID MANUFACTURING METHOD, AND CHEMICAL LIQUID

(71) Applicant: FUJIFILM Corporation, Tokyo (JP)

(72) Inventor: Tetsuya Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/584,956

(22) Filed: Sep. 27, 2019

(65) Prior Publication Data

US 2020/0023288 A1     Jan. 23, 2020

Related U.S. Application Data

(63) Continuation of application No. PCT/JP2018/010918, filed on Mar. 20, 2018.

(30) Foreign Application Priority Data

Mar. 31, 2017   (JP) .............................. JP2017-071159

(51) Int. Cl.
*B01D 11/04* (2006.01)
*B01D 39/18* (2006.01)
(Continued)

(52) U.S. Cl.
CPC ...... *B01D 11/0415* (2013.01); *B01D 11/0492* (2013.01); *B01D 39/1623* (2013.01);
(Continued)

(58) Field of Classification Search
CPC .... C11D 7/26; C11D 7/32; C11D 7/34; C11D 7/50; G03F 7/16; H01L 21/027;
(Continued)

(56) References Cited

U.S. PATENT DOCUMENTS 10,705,428 B2    7/2020   Yamanaka et al.
2005/0218068 A1  10/2005  Komatsu et al.
(Continued)

FOREIGN PATENT DOCUMENTS

JP    2002113334    4/2002
JP    2003251120    9/2003
(Continued)

OTHER PUBLICATIONS

JP 2016073922A English description, May 2016, Ogiwara Tsutomu et al.*

(Continued)

*Primary Examiner* — Akash K Varma
(74) *Attorney, Agent, or Firm* — JCIPRNET

(57) ABSTRACT

An object of the present invention is to provide a chemical liquid purification method by which a chemical liquid capable of inhibiting the occurrence of short in a semiconductor substrate manufactured by a photolithography process is obtained. Another object of the present invention is to provide a chemical liquid manufacturing method and a chemical liquid. The chemical liquid purification method of the present invention includes a purification step of filtering a liquid to be purified by using a filter, in which a filter satisfying a condition 1 or a condition 2 in the following test is used as the filter.

Test: 1,500 ml of a test liquid formed of the organic solvent is brought into contact with the filter for 24 hours under a condition of 23° C., and a content of particles containing at least one kind of metal selected from the group consisting of Fe, Al, Cr, Ni, and Ti in the test liquid after the contact satisfies a predetermined condition.

19 Claims, 2 Drawing Sheets

(51) Int. Cl.
  *B01D 39/20* (2006.01)
  *B01D 39/16* (2006.01)
  *C11D 7/50* (2006.01)
  *B01D 71/28* (2006.01)
  *G03F 7/16* (2006.01)

(52) U.S. Cl.
  CPC ......... *B01D 39/18* (2013.01); *B01D 39/2003* (2013.01); *B01D 71/28* (2013.01); *C11D 7/50* (2013.01); *G03F 7/16* (2013.01)

(58) Field of Classification Search
  CPC ....... C02F 1/44; B01D 53/22; B01D 11/0415; B01D 11/0492; B01D 11/04; B01D 39/1623; B01D 39/18; B01D 39/2003; B01D 39/20; B01D 39/16; B01D 39/00; B01D 2239/10; B01D 61/14; B01D 61/22; B01D 61/58; B01D 61/00; B01D 65/06; B01D 71/04; B01D 71/10; B01D 71/26; B01D 71/28; B01D 71/32; B01D 71/56; B01D 71/82
  USPC .......................................... 210/634
  See application file for complete search history.

(56) References Cited

U.S. PATENT DOCUMENTS

2009/0286178 A1  11/2009  Muroi et al.
2016/0300706 A1*  10/2016  Ogihara .................. B01D 65/02
2017/0365486 A1  12/2017  Park et al.

FOREIGN PATENT DOCUMENTS

| | | | |
|---|---|---|---|
| JP | 2007025341 | 2/2007 | |
| JP | 2010234344 | 10/2010 | |
| JP | 2016073922 | 5/2016 | |
| JP | 2016073922 A * | 5/2016 | ............ B01D 61/14 |
| JP | 2016138165 | 8/2016 | |
| JP | 2016201426 | 12/2016 | |
| JP | 2016209789 | 12/2016 | |
| TW | 201637088 | 10/2016 | |
| TW | 201708266 | 3/2017 | |

OTHER PUBLICATIONS

"International Search Report (Form PCT/ISA/210) of PCT/JP2018/010918", dated Jun. 26, 2018, with English translation thereof, pp. 1-7.
"Written Opinion of the International Searching Authority (Form PCT/ISA/237) of PCT/JP2018/010918", dated Jun. 26, 2018, with English translation thereof, pp. 1-13.
"Office Action of Japan Counterpart Application" with English translation thereof, dated Apr. 6, 2021, p. 1-p. 11.
"Office Action of Japan Counterpart Application", dated Aug. 4, 2020, with English translation thereof, p. 1-p. 11.
"Office Action of Taiwan Counterpart Application", dated Apr. 29, 2021, with Partial English translation thereof, p. 1-p. 8.

* cited by examiner

CHEMICAL LIQUID PURIFICATION METHOD, CHEMICAL LIQUID MANUFACTURING METHOD, AND CHEMICAL LIQUID

CROSS-REFERENCE TO RELATED APPLICATIONS

This application is a Continuation of PCT International Application No. PCT/JP2018/010918 filed on Mar. 20, 2018, which claims priority under 35 U.S.C. § 119(a) to Japanese Patent Application No. 2017-071159 filed on Mar. 31, 2017. The above application is hereby expressly incorporated by reference, in its entirety, into the present application.

BACKGROUND OF THE INVENTION

1. Field of the Invention

The present Invention relates to a chemical liquid purification method, a chemical liquid manufacturing method, and a chemical liquid.

2. Description of the Related Art

For manufacturing a semiconductor device, a photolithography process is used. During the photolithography process, a substrate such as a semiconductor wafer (hereinafter, referred to as "wafer" as well) is coated with an actinic ray-sensitive or radiation-sensitive resin composition (hereinafter, referred to as "resist composition" as well) so as to form an actinic ray-sensitive or radiation-sensitive film (hereinafter, referred to as "resist film" as well). Furthermore, the formed resist film is exposed, the exposed resist film is developed, and the developed resist film is rinsed, whereby a resist pattern is formed on the wafer.

In recent years, as semiconductor devices have been further scaled down, it has been required to inhibit a defect which can occur on a substrate in each step of photolithography.

JP2016-201426A describes "method for forming a coating film for lithography on a substrate for manufacturing a semiconductor device by spin-coating a substrate for manufacturing a semiconductor device with a composition for forming a coating film for lithography by using a spin coating device including an all-in-one filter constituted with a housing and a filtration membrane integrated with each other, and heating the substrate for manufacturing a semiconductor device coated with the composition for forming a coating film for lithography, in which in a case where an organic solvent is circulated for 24 hours at a rate of 10 ml/min, the weight of an eluate which can be extracted by one all-in-one filter used is equal to or smaller than 3 mg".

SUMMARY OF THE INVENTION

The inventors of the present invention examined the semiconductor substrate manufactured using the method for manufacturing a coating form lithography described in JP2016-201426A. As a result, the inventors have found that although the occurrence of a defect is inhibited, sometimes short (short circuit) of metal wiring in the obtained semiconductor substrate occurs.

Therefore, an object of the present invention is to provide a chemical liquid purification method by which a chemical liquid making it possible to inhibit the occurrence of short in a semiconductor substrate manufactured by a photolithography process (hereinafter, described as "having a short occurrence inhibition performance" as well) is obtained.

Another object of the present invention is to provide a chemical liquid manufacturing method and a chemical liquid.

In order to achieve the aforementioned objects, the inventors of the present invention carried out an intensive examination. As a result, the inventors have found that the objects can be achieved by the following constitution.

[1] A chemical liquid purification method including a purification step of filtering a liquid to be purified containing an organic solvent by using a filter, in which as the filter, a filter satisfying a condition 1 or a condition 2 in the following test is used.

Test: 1,500 ml of a test liquid formed of an organic solvent is brought into contact with a filter for 24 hours under a condition of 23° C., and a content of particles containing at least one kind of metal selected from the group consisting of Fe, Al, Cr, Ni, and Ti in the test liquid after the contact satisfies the condition 1 or 2.

Condition 1: in a case where the test liquid contains one kind of particles containing at least one kind of metal selected from the group consisting of Fe, Al, Cr, Ni, and Ti, a content of one kind of the particles in the test liquid is equal to or smaller than 5.0 mass ppm.

Condition 2: in a case where the test liquid contains two or more kinds of particles containing at least one kind of metal selected from the group consisting of Fe, Al, Cr, Ni, and Ti, a total content of two or more kinds of the particles in the test liquid is equal to or smaller than 5.0 mass ppm.

[2] The chemical liquid purification method described in [1], in which in a case where the test liquid after the contact contains one kind of ion containing at least one kind of metal selected from the group consisting of Fe, Al, Cr, Ni, and Ti, a content of one kind of the ion in the test liquid is equal to or smaller than 10 mass ppb, and in a case where the test liquid after the contact contains two or more kinds of ions containing at least one kind of metal selected from the group consisting of Fe, Al, Cr, Ni, and Ti, a total content of two or more kinds of the ions in the test liquid is equal to or smaller than 10 mass ppb.

[3] The chemical liquid purification method described in [1] or [2], in which in a case where the test liquid after the contact contains an organic impurity, a content of the organic impurity in the test liquid is equal to or smaller than 10 mass ppm.

[4] The chemical liquid purification method described in [3], in which the organic impurity contains at least one kind of compound selected from the group consisting of Formulae (1) to (7).

[5] The chemical liquid purification method described in any one of [1] to [4], further including a step of washing the filter by using a washing solution before the purification step, in which a solubility parameter of the washing solution is higher than 16 $(MPa)^{1/2}$.

[6] The chemical liquid purification method described in [5], in which the washing solution is at least one kind of compound selected from the group consisting of dimethylsulfoxide, n-methylpyrrolidone, diethylene glycol, ethylene glycol, dipropylene glycol, propylene glycol, ethylene carbonate, propylene carbonate, sulfolane, cyclohexane, cyclohexanone, cycloheptanone, cyclopentanone, 2-pentanone, and γ-butyrolactone.

[7] The chemical liquid purification method described in any one of [1] to [6], in which the filter is formed of at least one kind of material component selected from the group consisting of nylon, polyethylene, polypropylene, polyfluorocarbon, cellulose, diatomite, polystyrene, and glass.

[8] The chemical liquid purification method described in any one of [1] to [7], in which the purification step is a step of filtering the liquid to be purified by passing the liquid to be purified through at least two or more sheets of the filter.

[9] The chemical liquid purification method described in any one of [1] to [8], in which the filter includes at least a hydrophobic filter and a hydrophilic filter.

[10] The chemical liquid purification method described in [9], in which the filter of the last stage through which the liquid to be purified is passed in the purification step is the hydrophilic filter.

[11] The chemical liquid purification method described in any one of [8] to [10], in which a filtration differential pressure at the time of filtering the chemical liquid is equal to or lower than 250 kPa.

[12] The chemical liquid purification method described in any one of [1] to [11], in which the organic solvent is at least one kind of organic solvent selected from the group consisting of propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, butyl acetate, isoamyl acetate, isopropanol, and 4-methyl-2-pentanol.

[13] A chemical liquid manufacturing method including the chemical liquid purification method described in any one of [1] to [12].

[14] A chemical liquid manufactured by the chemical liquid manufacturing method described in [13].

[15] A chemical liquid manufactured by the chemical liquid manufacturing method described in [13], containing an organic solvent, in which the organic solvent is at least one kind of compound selected from the group consisting of propylene glycol monomethyl ether, propylene glycol monoethyl ether, propylene ghf monopropyl ether, propylene glycol monomethyl ether acetate, ethyl lactate, methyl methoxypropionate, cyclopentanone, cyclohexanone, γ-butyrolactone, diisoamyl ether, butyl acetate, isoamyl acetate, isopropanol, and 4-methyl-2-pentanol.

According to the present invention, it is possible to provide a chemical liquid manufacturing method by which a chemical liquid having a short occurrence inhibition performance (hereinafter, described as "having the effects of the present invention" as well) is obtained.

DESCRIPTION OF THE PREFERRED EMBODIMENTS

Figure 1:
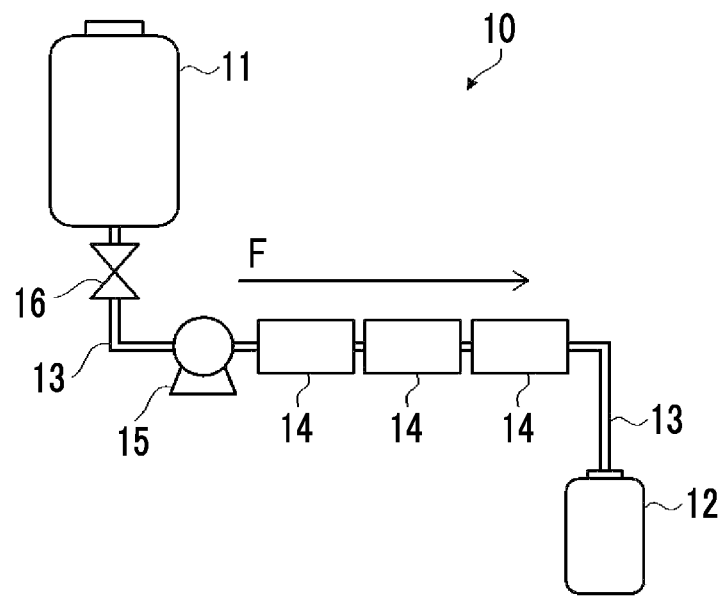
FIG. 1 is a schematic view showing a first aspect of a chemical liquid manufacturing device to which the chemical liquid manufacturing method according to an embodiment of the present invention can be applied.

Hereinafter, the present invention will be specifically described.

The following constituents will be described based on typical embodiments of the present invention in some cases, but the present invention is not limited to the embodiments.

In the present specification, a range of numerical values described using "to" means a range including the numerical values listed before and after "to" as a lower limit and an upper limit respectively.

In the present invention, "preparation" means not only the preparation of a specific material by means of synthesis or mixing but also the preparation of a predetermined substance by means of purchase and the like.

In the present specification, "ppm" means "parts-per-million ($10^{-6}$)", "ppb" means "parts-per-billion ($10^{-9}$)", "ppt" means "parts-per-trillion (10-12)", and "ppq" means "parts-per-quadrillion ($10^{-15}$)".

In the present invention, 1 Å (angstrom) equals 0.1 nm. In the present invention, regarding the description of a group (atomic group), in a case where whether the group is substituted or unsubstituted is not described, as long as the effects of the present invention are not impaired, the group includes a group which does not have a substituent and a group which has a substituent. For example, "hydrocarbon group" includes not only a hydrocarbon group which does not have a substituent (unsubstituted hydrocarbon group) but also a hydrocarbon group which has a substituent (substituted hydrocarbon group). The same is true for each compound.

Furthermore, in the present invention, "radiation" means, for example, far ultraviolet rays, extreme ultraviolet (EUV), X-rays, electron beams, and the like. In addition, in the present invention, light means actinic rays or radiation. In the present invention, unless otherwise specified, "exposure" includes not only exposure, far ultraviolet rays, X-rays, and EUV, and the like, but also lithography by particle beams such as Electron beams or ion beams.

[Chemical Liquid Manufacturing Method]

The chemical liquid purification method according to an embodiment of the present invention includes a purification step of filtering a liquid to be purified containing an organic solvent by using a filter, in which as the filter, a filter satisfying a condition 1 or a condition 2 in the following test is used.

According to the chemical liquid purification method, a chemical liquid having the effects of the present invention can be purified.

Regarding the reason of occurrence of short in metal wiring in a semiconductor substrate, the inventors of the present invention conducted an intensive examination. As a result, the inventors have found that in a case where specific metal particles are on a semiconductor substrate, the metal particles can form a complex by wrapping an impurity, and the complex can cause short in metal wiring. The inventors of the present invention have also found that the specific metal particles are derived from a chemical liquid used in each step of photography. Therefore, the inventors further repeated the examination regarding a method for reducing the specific metal particles contained in the chemical liquid. As a result, the inventors have found that in a case where a filter satisfying predetermined conditions is used as a filter used in a purification step of filtering a liquid to be purified containing an organic solvent, a chemical liquid is obtained which hardly causes short of metal wiring in a semiconductor substrate (has a short occurrence inhibition performance) to be obtained.

Hereinafter, each step of the chemical liquid purification method according to an embodiment of the present invention will be described.

[Purification Step: Step of Purifying Chemical Liquid]

(Content of Particles Containing at Least One Kind of Specific Metal in Test Liquid)

The chemical liquid purification method according to an embodiment of the present invention includes a step of purifying a liquid to be purified by using a filter. The filter used at this time satisfies a condition 1 or a condition 2 in the following test.

Test: 1,500 ml of a test liquid formed of an organic solvent is brought into contact with a filter for 24 hours under a condition of 23° C., and a content of particles containing at least one kind of metal selected from the group consisting of Fe, Al, Cr, Ni, and Ti (hereinafter, referred to as "specific metals" as well) in the test liquid after the contact is measured. Typically, examples of the above particles include Fe-containing particles, Al-containing particles, Cr-containing particles, Ni-containing particles, and Ti-containing particles. The particles mean those detected as particles in the measurement method which will be described later, and also include particles in which the specific metals are combined with each other (for example, particles containing Fe and Al).

In the above test, the test liquid is formed of an organic solvent. That is, the test liquid is formed of an organic solvent of the same type as the organic solvent contained in the liquid to be purified that is supposed to be purified using a filter. In a case where the liquid to be purified is a mixture of two or more kinds organic solvents, the test is performed using the mixture (obtained by mixing together organic solvents of same type at the same ratio). It is preferable that the test is performed in a clean room which will be described later.

In order to make it possible to more easily evaluate the amount of particles containing at least one kind of specific metal extracted from the filter (hereinafter, referred to as "specific metal particles" as well), it is preferable that the test liquid does not contain the specific metal particles at the stage before the test. In a case where the test liquid contains the specific metal particles at the stage before the test, first, the content of the specific metal particles in the test liquid before the test is measured, the content of the specific metal particles in the test liquid after the test is measured, and a difference between the contents is calculated. The difference is adopted as "content of specific metal particles in the test liquid after the contact" in the present embodiment. That is, "content of specific metal particles in the test liquid after the contact" means the amount of the specific metal particles extracted into the test liquid.

For measuring the content of the specific metal particles, Agilent 8800 triple quadrupole inductively Coupled Plasma-Mass Spectrometry (ICP-MS, for semiconductor analysis, option #200) is used. With the above measurement apparatus, the content of the specific metal particles in the test liquid can be measured. The measurement conditions are as described in Examples.

In addition to the aforementioned apparatus, for example, NexION 350s manufactured by PerkinElmer Inc., Agilent 8900 manufactured by Agilent Technologies, Inc., and the like can be used as apparatuses used for measuring the content of the specific metal particles.

Typically, examples of the method for bringing the test liquid into contact with a filter include a method in which the filter is immersed in the test liquid stored in an airtight container and stored in a constant-temperature chamber. Then, the filter is taken out of the test liquid after the contact, and the content of the specific metal particles contained in the test liquid after the contact is measured. The method for measuring the content is as described above.

Condition 1

According to a condition 1, in a case where the test liquid after the contact contains one kind of specific metal particles, the content of the specific metal particles in the test liquid is equal to or smaller than 5.0 mass ppm with respect to the total mass of the test liquid after the contact.

In a case where the test liquid after the contact contains one kind of specific metal particles, the content of the specific metal particles in the test liquid after the contact with respect to the total mass of the test liquid after the contact is more preferably equal to or smaller than 0.30 mass ppm, even more preferably equal to or smaller than 10 mass ppb, and particularly preferably equal to or smaller than 1.0 mass ppb. The lower limit thereof is not particularly limited, but is preferably equal to or greater than 0.01 mass ppt in general.

Condition 2

According to a condition 2, in a case where the test liquid after the contact contains two or more kinds of specific metal particles, the content of two or more kinds of the specific metal particles in the test liquid is equal to or smaller than 5.0 mass ppm with respect to the total mass of the test liquid after the contact.

In a case where the test liquid after the contact contains two or more kinds of specific metal particles, the content of two or more kinds of the specific metal particles in the test liquid after the contact with respect to the total mass of the test liquid after the contact is more preferably equal to or smaller than 0.30 mass ppm, even more preferably equal to or smaller than 10 mass ppb, and particularly preferably equal to or smaller than 1.0 mass ppb. The lower limit thereof is not particularly limited, but is preferably equal to or greater than 0.01 mass ppt in general.

The test liquid after the contact may contain particles containing a metal other than the specific metals. In the test liquid after the contact, there is no particular limitation on the total content of the metal particles including the particles containing a metal other than the specific metals. In view of obtaining a chemical liquid having further improved effects of the present invention, the total content of the metal particles with respect to the total mass of the test liquid after the contact is preferably equal to or smaller than 5.0 mass ppm, and more preferably equal to or smaller than 100 mass ppb. The lower limit thereof is not particularly limited, but is preferably equal to or greater than 0.01 mass ppt in general.

The content of the specific metal particles in the test liquid after the contact and the method for measuring the content have the same definition as the content of the specific metal particles and the method for measuring the content described above.

(Content of Ions Containing Specific Metal in Test Liquid)

For the chemical liquid purification method according to the embodiment of the present invention, in view of obtaining a chemical liquid having further improved effects of the present invention, it is more preferable that the test liquid after the contact satisfies a condition 3 or a condition 4.

Condition 3: in a case where the test liquid after the contact contains one kind of ions containing at least one kind of specific metal, the content of one kind of the ions in the test liquid is equal to or smaller than 10 mass ppb.

Condition 4: in a case where the test liquid after the contact contains two or more kinds of ions containing at least one kind of specific metal, the total content of two or more kinds of the ions in the test liquid is equal to or smaller than 10 mass ppb.

In order to make it possible to more easily evaluate the amount of ions containing the specific metals extracted from the filter (hereinafter, referred to as "specific metal ions" as well), it is preferable that the test liquid does not contain the specific metal ions at the stage before the test. In a case where the test liquid contains the specific metal ions at the stage before the test, first, the content of the specific metal ions in the test liquid before the test is measured, the content of the specific metal ions in the test liquid after the test is measured, and a difference between the contents is calculated. The difference is adopted as "content of specific metal ions in the test liquid after the contact" in the present embodiment. That is, "content of specific metal ions in the test liquid after the contact" means the amount of the specific metal ions extracted into the test liquid.

In the present specification, the specific metal ions mean ions of the specific metals (for example, $Fe^{2+}$ and the like), complex ions containing the specific metals (for example, $[Ni(NH_3)_6]^{2+}$), and the like.

For measuring the content of the specific metal ions, Agilent 8800 ICP-MS (for semiconductor analysis, option #200) is used. With the above measurement apparatus, the content of the specific metal ions in the test liquid can be measured. The measurement conditions are as described in Examples.

Condition 3

According to a condition 3, in a case where the test liquid after the contact contains one kind of specific metal ions, the content of one kind of the specific metal ions in the test liquid is equal to or smaller than 10 mass ppb with respect to the total mass of the test liquid after the contact.

In a case where the test liquid after the contact contains one kind of specific metal ions, the content of the specific metal ions in the test liquid after the contact with respect to the total mass of the test liquid after the contact is more preferably equal to or smaller than 3.5 mass ppb, and particularly preferably equal to or smaller than 1.0 mass ppb. The lower limit thereof is not particularly limited, but is preferably equal to or greater than 0.01 mass ppt in general.

Condition 4

According to a condition 4, in a case where the test liquid after the contact contains two or more kinds of specific metal ions, the content of two or more kinds of the specific metal ions in the test liquid is equal to or smaller than 10 mass ppb with respect to the total mass of two or more kinds of the specific metal ions in the test liquid after the contact.

In a case where the test liquid after the contact contains two or more kinds of specific metal ions, the total content of two or more kinds of the specific metal ions in the test liquid after the contact with respect to the total mass of the test liquid after the contact is more preferably equal to or smaller than 3.5 mass ppb, and particularly preferably equal to or smaller than 1.0 mass ppb. The lower limit thereof is not particularly limited, but is preferably equal to or greater than 0.01 mass ppt in general.

(Content of Organic Impurity in Test Liquid)

For the chemical liquid purification method according to the embodiment of the present invention, in view of obtaining a chemical liquid having further improved effects of the present invention, it is more preferable that the test liquid after the contact satisfies a condition 5.

Condition 5: in a case where the test liquid contains an organic impurity, the content of the organic impurity in the test liquid is equal to or smaller than 10 mass ppb.

In the present specification, the organic impurity means an organic compound which is different from the organic solvent and is contained in the test liquid in an amount equal to or smaller than 10,000 mass ppm with respect to the total mass of organic solvents (in a case where the chemical liquid contains a mixture of organic solvents, that is, in a case where the test liquid is a mixture of organic solvents, the organic solvents means the mixture). That is, in the present specification, an organic compound which is contained in the chemical liquid in an amount equal to or smaller than 10,000 mass ppm with respect to the total mass of the aforementioned organic solvent corresponds to an organic impurity but does not correspond to the organic solvent.

In a case where the organic solvent contains a plurality of types of organic compounds, and the content of each of the organic compounds is equal to or smaller than 10,000 mass ppm, each of the organic compounds corresponds to an organic impurity.

In order to make it possible to more easily evaluate the amount of organic impurity extracted from the filter, it is preferable that the test liquid does not contain the organic impurity at the stage before the test. In a case where the test liquid contains the organic impurity at the stage before the test, first, the content of the organic impurity in the test liquid before the test is measured, the content of the organic impurity in the test liquid after the test is measured, and a difference between the contents is calculated. The difference is adopted as "content of the organic impurity in the test liquid after the contact" in the present embodiment. That is, "content of the organic impurity in the test liquid after the contact" means the amount of the organic impurity extracted into the test liquid.

For measuring the content of the organic impurity, a gas chromatography mass spectrometry (tradename "GCMS-2020", manufactured by Shimadzu Corporation) is used. The measurement conditions are as described in Examples. Furthermore, although there is not particular limitation, in a case where the organic impurity is a polymer compound, the techniques such as pyrolyzer-quadrupole time-of-flight/mass spectrometry (Py-QTOF/MS), pyrolyzer-ion trapping mass spectrometry (Py-IT/MS), pyrolyzer magnetic sector field mass spectrometry (Py-Sector/MS), pyrolyzer Fourier transform ion cyclotron resonance mass spectrometry (Py-FTICR-MS), pyrolyzer quadrupole mass spectrometry (Py-Q/MS), and pyrolyzer ion trap mass time-of-flight mass spectrometry (Py-IT-TOF/MS) may be used for identifying the structure or quantifying the concentration from the decomposition product. For example, for Py-QTOF/MS, a device manufactured by Shimadzu Corporation or the like can be used.

Condition 5

According to a condition 5, in a case where the test liquid after the contact contains the organic impurity, the content of the organic impurity in the test liquid with respect to the total mass of the test liquid after the contact is equal to or smaller than 10 mass ppm. In view of obtaining a chemical liquid having further improved effects of the present invention, the content of the organic impurity is more preferably equal to or smaller than 3.0 mass ppm, and even more preferably equal to or smaller than 2.5 mass ppm. The lower limit thereof is not particularly limited, but is preferably equal to or greater than 0.10 mass ppm in general.

Example of the organic impurity include compounds represented by Formulae I to V.

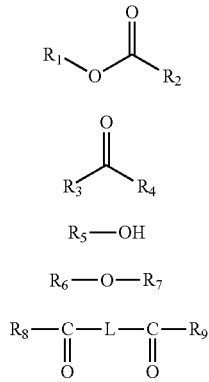

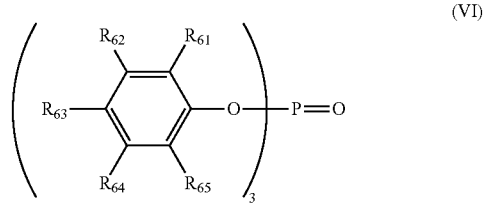

In Formula I, $R_1$ and $R_2$ each independently represent an amino group, an aryl group, an alkyl group, or a cycloalkyl group. Alternatively, $R_1$ and $R_2$ form a ring by being bonded to each other.

In a case where each of $R_1$ and $R_2$ represents a group other than an amino group, the number of carbon atoms in each of $R_1$ and $R_2$ is not particularly limited. Generally, the number of carbon atoms is 1 to 20 in many cases.

In Formula II, $R_3$ and $R_4$ each independently represent a hydrogen atom, an amino group, an aryl group, an alkyl group, an alkenyl group, a cycloalkyl group, or a cycloalkenyl group. Alternatively, $R_3$ and $R_4$ form a ring by being bonded to each other. Here, $R_3$ and $R_4$ do not simultaneously represent a hydrogen atom.

In a case where each of $R_3$ and $R_4$ represents a group other than an amino group, the number of carbon atoms in each of $R_3$ and $R_4$ is not particularly limited. Generally, the number of carbon atoms is 1 to 20 in many cases.

In Formula III, $R_5$ represents an alkyl group, an aryl group, or a cycloalkyl group. Generally, the number of carbon atoms in $R_5$ is 1 to 20 in many cases.

In Formula IV, $R_6$ and $R_7$ each independently represent an alkyl group, an aryl group, or a cycloalkyl group. Alternatively, $R_6$ and $R_7$ form a ring by being bonded to each other. The number of carbon atoms in each of $R_6$ and $R_7$ is not particularly limited. Generally, the number of carbon atoms is 1 to 20 in many cases.

In Formula V, $R_8$ and $R_9$ each independently represent an alkyl group, an aryl group, an alkyloxy group, or a cycloalkyl group. Alternatively, R8 and R9 form a ring by being bonded to each other. L represents a single bond or a divalent linking group.

The number of carbon atoms in each of $R_8$ and $R_9$ is not particularly limited. Generally, the number of carbon atoms is 1 to 20 in many cases.

Examples of the organic impurity also include a compound represented by Formula VI.

In Formula VI, $R_{61}$ to $R_{65}$ each independently represent an alkyl group. The number of carbon atoms in each of $R_{61}$ to $R_{65}$ is not particularly limited. Generally, the number of carbon atoms is 1 to 10 in many cases.

Regarding the condition 5, in view of obtaining a chemical liquid having further improved effects of the present invention, it is preferable that the organic impurity contains at least one kind of compound selected from the group consisting of Formulae (1) to (7).

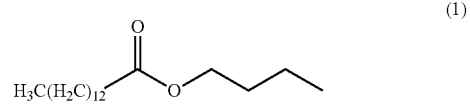

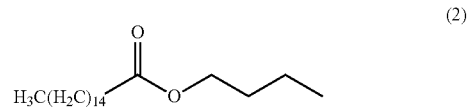

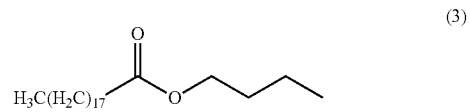

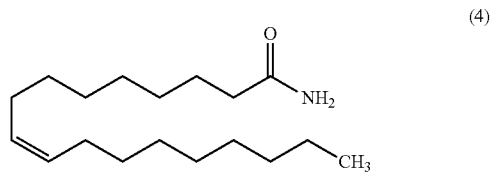

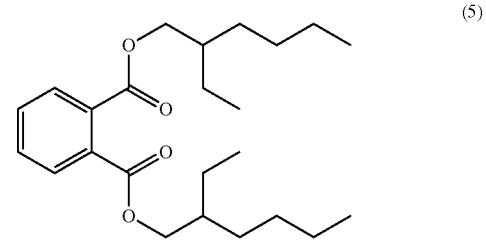

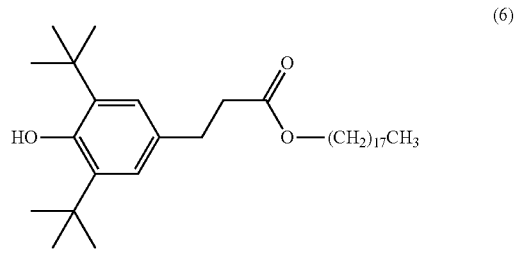

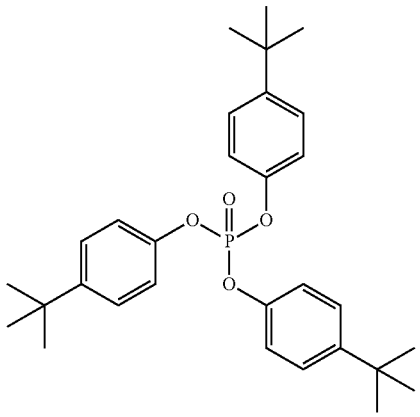

(7)

(Filter)

As the filter used in the purification step in the embodiment of the present invention, known filters can be used without particular limitation. Particularly, in view of obtaining a chemical liquid having further improved effects of the present invention, it is preferable that the filter contains at least one kind of material component selected from the group consisting of nylon, polyethylene (including high-density polyethylene and high-molecular-weight polyethylene), polypropylene (including high-density polypropylene and high-molecular-weight polypropylene), polyfluorocarbon (for example, polytetrafluoroethylene; PTFE and the like), cellulose, diatomite, polystyrene, and glass.

It is preferable that the purification step is a step of filtering liquid to be purified by passing the liquid to be purified through at least two sheets of the filters. In other words, it is preferable that the purification step is a step of filtering the liquid to be purified by causing the liquid to be purified to sequentially pass through two sheets of filters by using at least two sheets of filters in series. It is more preferable that the purification step is a step of filtering the liquid to be purified by passing the liquid to be purified through at least three or more sheets of filters. In other words, it is preferable that the purification step is a step of purifying the liquid to be purified by using two or more sheets (preferably three of more sheets) of filters.

At this time, filtering with a first filter (filter through which the liquid to be purified passes for the first time, an early stage filter) may be performed only once or performed two or more times. In a case where filtering is performed two or more times by using different filters in combination, the filters may be of the same type or different types.

Particularly, in view of obtaining further improved effects of the present invention, it is preferable that two or more sheets of the filters to be used include at least a hydrophobic filter and a hydrophilic filter. In other words, in the purification step using two or more sheets of the filters, it is preferable to use one or more sheets of hydrophobic filters and one or more sheets of hydrophilic filters as the filters.

In the present specification, "hydrophobic" means that a water contact angle of a filter at 25° C. is equal to or greater than 45°, and "hydrophilic" means that a water contact angle of a filter at 25° C. is less than 45°.

In a case where the purification step is a step of filtering the liquid to be purified by passing the liquid through two or more sheets of filters, the liquid to be purified may pass through the filters in any order without particular limitation. However, it is preferable that the last filter through which the liquid to be purified passes (in the present specification, the filter through which the liquid to be purified passes at the last stage of the purification step is referred to as "last filter") is a hydrophilic filter. The hydrophilic filter excellently interact with the specific metal particles contained in the liquid to be purified and the ions containing the specific metals, and more easily adsorb the specific metal particles and the ions. Accordingly, it is easy to control the content of the specific metal particles and the ions containing the specific metals in the obtained chemical liquid to be within a desired range.

In the following section, for describing an aspect in which the liquid to be purified is filtered through two or more kinds of filters, the terms such as "first filter" and "second filter" will be used. Herein, the first filter means a filter through which the liquid to be purified passes before passing through the second filter.

Each of the first filter and the second filter is a filter satisfying the condition 1 and the condition 2. It is preferable that each of the first filter and the second filter satisfy the condition 3 or 4 and the condition 5.

In a case where the purification step is a step of filtering the liquid to be purified by causing the liquid to be purified to sequentially pass through two or more sheets of filters, although there is no particular limitation, a differential pressure before and after the filters (hereinafter, referred to as "filtration differential pressure" as well) at the time of passing the liquid to be purified through the filters is preferably equal to or lower than 250 kPa, and more preferably equal to or lower than 200 kPa. The lower limit thereof is not particularly limited, but is preferably equal to or greater than 50 kPa. In a case where the filtration differential pressure is equal to or lower than 250 kPa, it is possible to prevent an excessively high pressure is applied to the filters, and accordingly, the eluate could be reduced.

In a case where the purification step is a step of filtering the liquid to be purified by passing the liquid to be purified through two or more sheets of filters, although there is no particular limitation, it is preferable that the pore size varies between the filters.

It is preferable that the pore size of the second filter is the same as or smaller than the pore size of the first filter. Furthermore, two sheets of first filters having different pore sizes may be used.

In the present specification, as the pore size of the filter, the nominal values form filter manufacturers can be referred to. A commercial filter can be selected from various filters provided from, for example, Pall Corporation Japan, Advantec Toyo Kaisha, Ltd., Nihon Entegris KK (former MICRONICS JAPAN CO., LTD.), KITZ MICRO FILTER CORPORATION, or the like. In addition, it is possible to use "P-NYLON FILTER (pore size: 0.02 μm, critical surface tension: 77 mN/m)" made of polyamide; (manufactured by Pall Corporation Japan), "PE•CLEAN FILTER (pore size: 0.02 μm)" made of high-density polyethylene; (manufactured by Pall Corporation Japan), and "PE•CLEAN FILTER (pore size: 0.01 μm)" made of high-density polyethylene; (manufactured by Pall Corporation Japan).

In a case where a filter having a pore size smaller than that of the first filter is used as the second filter, a ratio between the pore size of the second filter and the pore size of the first filter (pore size of second filter/pore size of first filter) is preferably 0.01 to 0.99, more preferably 0.1 to 0.9, and even more preferably 0.2 to 0.9. In a case where the pore size of the second filter is within the above range, fine foreign substances mixed into the liquid to be purified are more reliably removed.

From the viewpoint of inhibiting the increase of the specific metal particles and the ions containing specific metals in the chemical liquid during the storage of the obtained chemical liquid, provided that an interaction radius in the Hansen solubility parameter space derived from the material of the filter is R0, and that a radius of a sphere in the Hansen space derived from the organic solvent contained in the chemical liquid is Ra, it is preferable that the chemical liquid and the material of the filter are combined such that the chemical liquid and the filter have a relationship satisfying a relational expression of $(Ra/R0) \leq 1$, and the chemical liquid is purified by the material of the filter satisfying the relational expression. $(Ra/R0)$ is preferably equal to or smaller than 0.98, and more preferably equal to or smaller than 0.95. The lower limit of $(Ra/R0)$ is preferably equal to or greater than 0.5, more preferably equal to or greater than 0.6, and even more preferably 0.7. In a case where Ra/R0 is within the above range, the increase in the content of the specific metal particles and the ions in the chemical liquid during long-term storage is inhibited, although the mechanism is unclear.

The combination of the filter and the organic solvent is not particularly limited, and examples thereof include those described in US2016/0089622.

The filtering pressure affects the filtering accuracy. Therefore, it is preferable that the pulsation of pressure at the time of filtering is as low as possible.

The filtering speed is not particularly limited. However, in view of obtaining a chemical liquid having further improved effects of the present invention, the filtering speed is preferably equal to or higher than $1.0 \text{ L/min/m}^2$, more preferably equal to or higher than $0.75 \text{ L/min/m}^2$, and even more preferably equal to or higher than $0.6 \text{ L/min/m}^2$.

For the filter, an endurable differential pressure for assuring the filter performance (assuring that the filter will not be broken) is set. In a case where the endurable differential pressure is high, by increasing the filtering pressure, the filtering speed can be increased. That is, it is preferable that the upper limit of the filtering speed is generally equal to or lower than $10.0 \text{ L/min/m}^2$ although the upper limit usually depends on the endurable differential pressure of the filter. Meanwhile, in a case where the filtering pressure is reduced, it is possible to efficiently reduce the amount of particle-like foreign substances or impurities dissolved in the chemical liquid, and to adjust the pressure according to the purpose.

In view of obtaining a chemical liquid having further improved effects of the present invention, the filtering pressure is preferably 0.001 to 1.0 MPa, more preferably 0.003 to 0.5 MPa, and even more preferably 0.005 to 0.3 MPa. Particularly, in a case where a filter having a small pore size is used, by increasing the filtering pressure, it is possible to efficiently reduce the amount of particle-like foreign substances or impurities dissolved in the chemical liquid. In a case where a filter having a pore size smaller than 20 nm is used, the filtering pressure is particularly preferably 0.005 to 0.3 MPa.

The smaller the pore size of the filtration filter, the lower the filtering speed. However, for example, in a case where a plurality of filtration filters of the same type are connected to each other in parallel, the filtering area is enlarged, and the filtering pressure is reduced. Therefore, in this way, the reduction in the filtering speed can be compensated.

It is more preferable that the purification step has the following steps. In the purification step, each of the following steps may be performed once or plural times. Furthermore, the order of the following steps is not particularly limited. Each of the filters used in the following steps is a filter satisfying the condition 1 or the condition 2 described above, and it is preferable that the filters satisfy the condition 3 or 4 and the condition 5.

1. Particle removing step
2. Metal ion removing step
3. Organic impurity removing step Hereinafter, each of the steps will be described.

<Particle Removing Step>

It is preferable that the purification step has a particle removing step. The particle removing step is a step of removing the particles in the liquid to be purified by using a particle removing filter.

Although there is no particular limitation, the particle removing filter is in the form of a filter for removing particles having a diameter equal to or smaller than 20 nm.

The diameter of particles to be removed by the filter is preferably 1 to 15 nm, and more preferably 1 to 12 nm. In a case where the diameter of the particles to be removed is equal to or smaller than 15 nm, finer particles can be removed. In a case where the diameter of the particles to be removed is equal to or greater than 1 nm, filtering efficiency is improved.

The diameter of particles to be removed means the minimum size of particles that can be removed by the filter. For example, in a case where the diameter of the particles to be removed by the filter is 20 nm, particles having a diameter equal to or greater than 20 nm can be removed.

Examples of the material of the particle removing filter include nylon such as 6-nylon and 6,6-nylon, polyethylene, polypropylene, polystyrene, polyimide, polyamide imide, polyfluorocarbon, and the like.

Either or both of polyimide and polyamide imide may have at least one group selected from the group consisting of a carboxy group, a salt-type carboxy group, and a —NH— bond. In view of solvent resistance, polfluorocarbon, polyimide and/or polyamide imide are excellent. Furthermore, from the viewpoint of adsorbing metal ions, nylon such as 6-nylon and 6,6-nylon are particularly preferable.

In a case where the purification step has the particle removing step, a plurality of particle removing filters may be used. In a case where the plurality of particle removing filters are used, it is more preferable that one of the filters is a filter for removing particles having a diameter equal to or greater than 50 nm (for example, a microfiltration membrane for removing fine particles having a pore size equal to or greater than 50 nm). In a case where fine particles such as colloidized impurities are present in the liquid to be purified, by filtering the liquid to be purified by using a filter for removing particles having a diameter equal to or greater than 50 nm (for example, a microfiltration membrane for removing fine particles having a pore size equal to or greater than 50 nm) before filtering the liquid to be purified by using a filter for removing particles having a diameter equal to or smaller than 20 nm (for example, a microfiltration membrane having a pore size equal to or smaller than 20 nm), the filtering efficiency of the filter for removing particles having a diameter equal to or smaller than 20 nm (for example, a microfiltration membrane having a pore size equal to or smaller than 20 nm) is improved, and the particle removing performance is further improved.

<Metal Ion Removing Step>

The purification step may have a metal ion removing step. As the metal ion removing step, a step of passing the liquid to be purified through a metal ion adsorption filter is preferable.

The metal ion adsorption filter is not particularly limited, and examples thereof include and examples thereof include known metal ion adsorption filters.

The metal ion adsorption filter is preferably a filter which can perform ion exchange. Herein, examples of the metal ions to be adsorbed include ions containing the specific metals and ions containing metal other than the specific metals. From the viewpoint of improving the metal ion adsorption performance, it is preferable that the metal ion adsorption filter contains an acid group on the surface thereof. Examples of the acid group include a sulfo group, a carboxy group, and the like.

Examples of the base material (material) constituting the metal ion adsorption filter include cellulose, diatomite, nylon, polyethylene, polypropylene, polystyrene, polyfluorocarbon, and the like. From the viewpoint of the metal ion adsorption efficiency, nylon is particularly preferable.

<Organic Impurity Removing Step>

The purification step may have an organic impurity removing step. As the organic impurity removing step, a step of passing the liquid to be purified through an organic impurity adsorption filter is preferable.

The organic impurity adsorption filter is not particularly limited, and examples thereof include known organic impurity adsorption filters.

In view of improving the organic impurity adsorption performance, it is preferable that the organic impurity adsorption filter has the skeleton of an organic substance, which can interact with the organic impurity, on the surface thereof (in other words, it is preferable that the surface of the organic impurity adsorption filter is modified with the skeleton of an organic substance which can interact with the organic impurity). Examples of the skeleton of an organic substance which can interact with the organic impurity include a chemical structure which can react with the organic impurity so as to make the organic impurity trapped in the organic impurity adsorption filter. More specifically, in a case where the chemical liquid contains long-chain n-alkyl alcohol (corresponding to a structural isomer in a case where the chemical liquid contains long-chain 1-alkyl alcohol as an organic solvent) as the organic impurity, examples of the skeleton of an organic substance include an alkyl group. Furthermore, in a case where the chemical liquid contains dibutylhydroxytoluene (BHT) as the organic impurity, examples of the skeleton of an organic substance include a phenyl group.

Examples of the base material (material) constituting the organic impurity adsorption filter include cellulose supporting active carbon, diatomite, nylon, polyethylene, polypropylene, polystyrene, polyfluorocarbon, and the like.

Furthermore, as the organic impurity adsorption filter, it is possible to use the filters obtained by fixing active carbon to non-woven cloth that are described in JP2002-273123A and JP2013-150979A.

For the organic impurity adsorption filter, in addition to the chemical adsorption described above (adsorption using the organic impurity adsorption filter having the skeleton of an organic substance, which can interact with the organic impurity, on the surface thereof), a physical adsorption method can be used.

For example, in a case where the organic impurity contains BHT, the structure of BHT is larger than 10 angstroms (=1 nm). Accordingly, in a case where an organic impurity adsorption filter having a pore size of 1 run is used, BHT cannot pass through the pore of the filter. That is, by being physically trapped by the filter, BHT is removed from the liquid to be purified. In this way, for removing an organic impurity, not only a chemical interaction but also a physical removing method can be used. Here, in this case, a filter having a pore size equal to or greater than 3 nm is used as "particle removing filter", and a filter having a pore size less than 3 nm is used as "organic impurity adsorption filter".

[Washing Step: Step of Washing Filter]

It is preferable that the chemical liquid purification method according to the embodiment of the present invention further includes a step of washing the filter. The method for washing the filter is not particularly limited, and examples thereof include a method of immersing the filter in a washing solution, a method of causing a washing solution to flow through the filter, and a method of using these methods in combination.

In a case where the filter is washed, it is easy to control the amount of the component extracted from the filter such that the conditions described above relating to the test liquid are satisfied. As a result, a chemical liquid having a further improved effect of the present invention is obtained.

As the washing solution, known washing solutions can be used without particular limitation. Examples of the washing solution include water, an organic solvent, and the like. As the organic solvent, for example, organic solvents that the chemical liquid can contain, such as alkylene glycol monoalkyl ether carboxylate, alkylene glycol monoalkyl ether, lactic acid alkyl ester, alkoxyalkyl propionate, cyclic lactone (preferably having 4 to 10 carbon atoms), a ketone compound which may have a ring (preferably having 4 to 10 carbon atoms), alkylene carbonate, alkoxyalkyl acetate, and alkyl pyruvate may be used.

More specifically, examples of the washing solution include propylene glycol monomethyl ether, propylene glycol monomethyl ether acetate, dimethyl sulfoxide, n-methyl pyrrolidone, diethylene glycol, ethylene glycol, dipropylene glycol, propylene glycol, ethylene carbonate, propylene carbonate, sulfolane, cyclohexane, cyclohexanone, cycloheptanone, cyclopentanone, 2-heptanone, γ-butyrolactone, a mixture of these, and the like.

Particularly, in view of obtaining a chemical liquid having a further improved effect of the present invention, a solubility parameter of the washing solution is preferably higher than 16 $(MPa)^{1/2}$, more preferably equal to or higher than 18.0, and even more preferably equal to or higher than 18.9. The upper limit of the solubility parameter is not particularly limited, but is preferably equal to or lower than 30.0 in general.

The solubility parameter is a value represented by the square root of molecular cohesive energy, and described in Polymer Handbook (Second Edition), Chapter IV, Solubility Parameter Values. The value described in the document is adopted as a solubility parameter in the present specification. The unit thereof is $(MPa)^{1/2}$. The solubility parameter refers to a value at 25° C.

Regarding solubility parameters that are not described in data, the values calculated by the method described in R. F. Fedors, Polymer Engineering Science, 14, p. 147-154 (1974) are adopted as solubility parameters in the present specification.

In a case where the washing solution is a mixed solvent of two or more kinds of solvents, the solubility parameter of the washing solution is the sum of the products of a volume fraction of each of the solvents mixed together and a solubility parameter of each of the solvents. For example, a solubility parameter of a mixed solvent obtained by mixing water (solubility parameter: 23.4) with acetone (solubility parameter: 10.0) at a ratio (volume ratio) of water/acetone=0.5/0.5 is 23.4×0.5+10.0×0.5=16.7.

Particularly, as the washing solution, in view obtaining a further improved effect of the present invention, at least one kind of compound selected from the group consisting of dimethyl sulfoxide (26.7), n-methyl pyrrolidone (23.0), diethylene glycol (29.1), ethylene glycol (28.5), dipropylene glycol (31.2), propylene glycol (30.2), ethylene carbonate (29.6), propylene carbonate (27.6), sulfolane (25.9), cyclohexanone (19.6), cycloheptanone (19.7), cyclopentanone (18.9), 2-heptanone (21.2), and γ-butyrolactone (25.5) is preferable.

[Chemical Liquid Manufacturing Method]

The chemical liquid manufacturing method according to the embodiment of the present invention is a chemical liquid manufacturing method having the chemical liquid purification method described above. Hereinafter, by using FIGS. 1 to 3, the chemical liquid manufacturing method according to the embodiment of the present invention will be described.

(First Aspect)

FIG. 1 is a schematic view showing a first aspect of a chemical liquid manufacturing device to which the chemical liquid manufacturing method according to the embodiment of the present invention can be applied. In a chemical liquid manufacturing device 10 shown in FIG. 1, a tank 11 and a filling device 12 are connected to each other through a pipe line 13, and the liquid to be purified is transported along an arrow F in FIG. 1. Three consecutive filtering devices 14 are provided in the middle of the pipe line 13. Each of the filtering devices 14 has one filter. The liquid to be purified is stored in the tank 11 first. Then, in a case where a valve 16 is opened and a pump 15 is operated, the liquid to be purified is transported to the filling device 12 along the arrow F. While being transported, the liquid to be purified is filtered by sequentially passing through the filters that the three filtering devices 14 have.

For the manufacturing device 10, for example, a dead-end filtration type device is illustrated which filters the entirety of the liquid to be purified introduced into the filtering device by using filters. However, the purification device according to the embodiment of the present invention is not limited thereto, and may be a cross flow-type filtering device, which separates the introduced liquid to be purified into a liquid to be purified having undergone purification and a concentrate (sometimes the concentrate is introduced again into the filter as a liquid to be purified), or a device adopting the above methods in combination.

FIG. 1 shows an aspect in which the chemical liquid manufacturing device 10 comprises three filtering devices 14. However, the chemical liquid manufacturing device to which the chemical liquid manufacturing method according to the embodiment of the present invention can be applied is not limited thereto, and just need to comprise at least one filtering device 14.

Purification Step (First Aspect)

The chemical liquid manufacturing method according to the present embodiment includes the chemical liquid purification method described above. Typically, the method for purifying the chemical liquid by using the chemical liquid manufacturing device 10 is performed by transporting the liquid to be purified stored in the tank 11 along the direction of the arrow F and passing the liquid to be purified through the filtering devices 14. At this time, as the filters, filters satisfying the predetermined conditions described above are used.

Washing Step (First Aspect)

It is preferable that the chemical liquid manufacturing method according to the present embodiment has the washing step described above. In a case where the chemical liquid manufacturing method has the washing step, the filters may be washed on the outside of the chemical liquid manufacturing device 10. In other words, the filters may be detached from the filtering devices 14 that the manufacturing device 10 comprises and washed using a washing device (for example, a washing tank or the like) not shown in the drawing, and the washed filters may be mounted on the chemical liquid manufacturing device 10.

Furthermore, the filters may be washed using the chemical liquid manufacturing device 10. That is, the washing solution is stored in the tank 11. Then, the washing solution is transported to the filling device 12 along the arrow F. While being transported, the washing solution washes each of the filtering devices 14 (and the filters mounted thereon) and the pipe line 13. This method is preferable because the filters as well as liquid contact portions of the tank 11, the pipe line 13, and the like can be simultaneously washed.

(Second Aspect)

Figure 2:
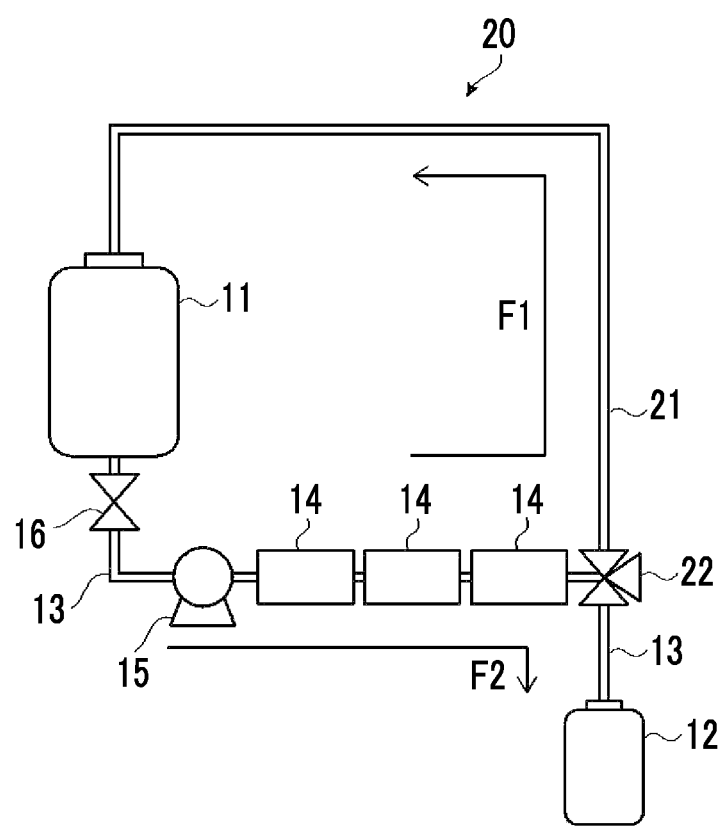
FIG. 2 is a schematic view showing a second aspect of the chemical liquid manufacturing device to which the chemical liquid manufacturing method according to an embodiment of the present invention can be applied.

FIG. 2 is a schematic view showing a second aspect of the chemical liquid manufacturing device to which the chemical liquid manufacturing method according to the embodiment of the present invention can be applied. In a chemical liquid manufacturing device 20 shown in FIG. 2, the tank 11 and the filling device 12 are connected to each other through the pipe line 13, and three consecutive filtering devices 14 are provided in the middle of the pipe line 13. Each of the filtering devices 14 includes one filter. The manufacturing device comprises a valve 22, which connects a circulation pipe line 21 connected to the tank 11 to the pipe line 13, after the filtering devices 14.

Purification Step (Second Aspect)

First, the liquid to be purified is stored in the tank 11. Then, the valve 16 is opened, the pump 15 is operated, and the liquid to be purified is filtered by passing through the filters included in the three filtering devices 14. The filtered liquid to be purified flows back to the tank 11 through the valve 22 and the circulation pipe line 21 (arrow F1 in FIG. 2). The chemical liquid manufacturing device 20 comprises the circulation pipe line 21. Accordingly, in the purification step, the chemical liquid manufacturing device 20 can perform circulation filtration by which the liquid to be purified passes each of the filtering devices 14 two or more times while being circulated.

That is, the filtered liquid to be purified having flowed back to the tank 11 is filtered again by passing through the filtering devices 14 provided in the pipe line 13 by the pump 15. At this time, the liquid to be purified may flow back to the tank 11 from the circulation pipe line 21 or may be transported to the filling device 12 from the valve 22 through the pipe line 13.

Washing Step (Second Aspect)

It is preferable that the chemical liquid manufacturing method according to the present embodiment has the washing step described above. In a case where the chemical liquid manufacturing method has the washing step, the filters can also be washed using the chemical liquid manufacturing device 20. That is, the washing solution may be stored in the tank 11, and while being circulated and transported to the tank 11 along the arrow F2, the washing solution may pass through each of the filtering devices 14 (and the filters mounted thereon) and the pipe line 13 such that the filters are washed. Furthermore, the above operation may be repeated by reusing the washing solution having been circulated and transported to the tank 11 (circulation washing). According to this method, it is possible to efficiently wash the filters until the filters are cleaned to a desired degree while circulating the washing solution.

(Third Aspect)

Figure 3:
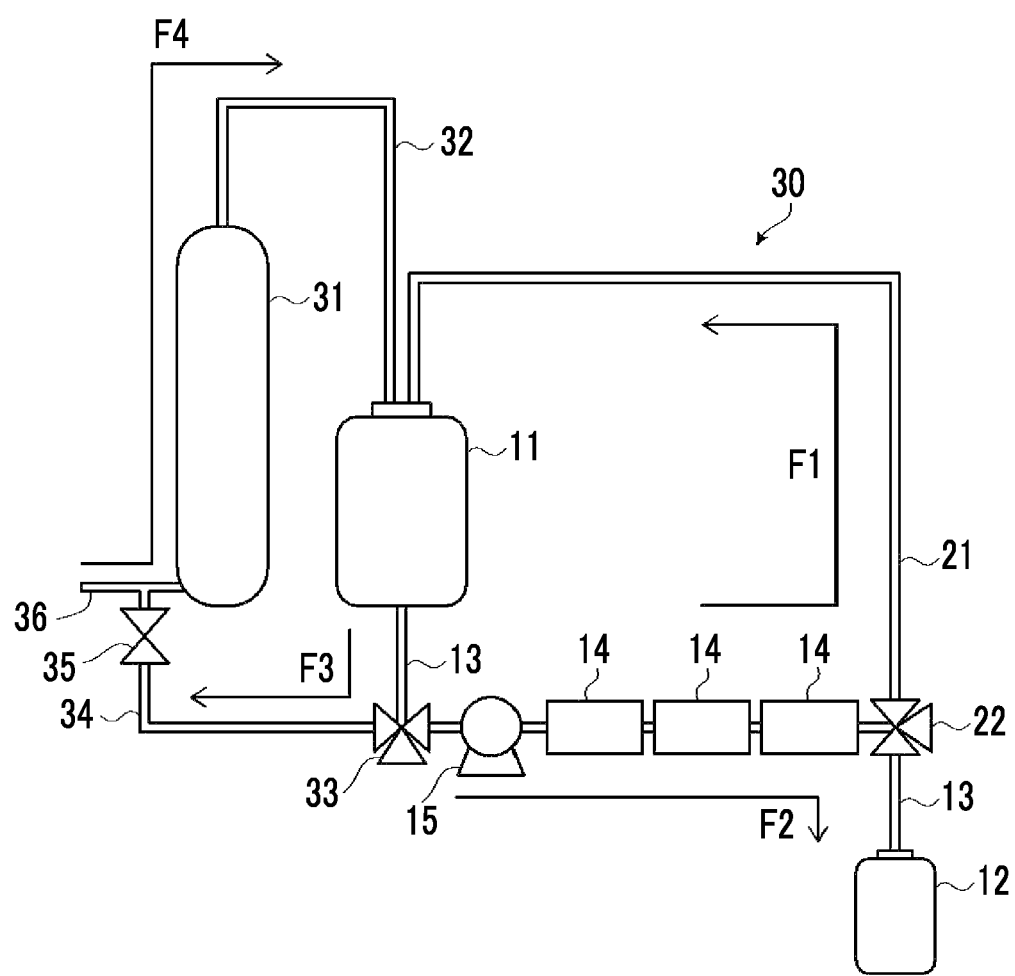
FIG. 3 is a schematic view showing a third aspect of the chemical liquid manufacturing device to which the chemical liquid manufacturing method according to an embodiment of the present invention can be applied.

FIG. 3 is a schematic view showing a third aspect of the chemical liquid manufacturing device which the chemical liquid manufacturing method according to the embodiment of the present invention can be applied. In a chemical liquid manufacturing device 30 shown in FIG. 3, the tank 11 and the filling device 12 are connected to each other through the pipe line 13, and three consecutive filtering devices 14 are provided in the middle of the pipe line 13. Each of the three filtering devices 14 includes one filter. Furthermore, the chemical liquid manufacturing device 30 comprises the valve 22, which connects the circulation pipe line 21 connected to the tank 11 to the pipe line 13, after the filtering devices 14.

The chemical liquid manufacturing device 30 also comprises a distillation column 31 which is connected to the tank 11 through a distillation pipe line 32. Furthermore, the tank 11 is connected to a raw material injection pipe line 36 through the pipe line 13, a valve 33, a distillation column circulating pipe line 34, and a valve 35, and the raw material injection pipe line 36 is connected to the distillation column 31.

Purification Step (Third Aspect)

In the chemical liquid manufacturing device 30, first, the liquid to be purified is introduced into the distillation column 31 from the raw material injection pipe line 36, and stored in the distillation column 31. By a concentration device not shown in the drawing, the stored liquid to be purified is concentrated and stored in the tank 11 through the distillation pipe line 32. The liquid to be purified stored in the tank 11 is circulated and filtered through a path F1 in the drawing or filtered through a path F2 in the drawing. The method for purifying the liquid to be purified through the aforementioned path is as described in the first embodiment and the second embodiment.

Washing Step (Third Aspect)

It is preferable that the chemical liquid manufacturing method according to the present embodiment has the washing step described above. In a case where the chemical liquid manufacturing method has the washing step, the filters can also be washed using the chemical liquid manufacturing device 30. That is, the washing solution may be stored in the tank 11, and while being circulated and transported to the tank 11 along the arrow F1, the washing solution may pass through each of the filtering devices 14 (and the filters mounted thereon) and the pipe line 13 such that the filters are washed. Furthermore, the above operation may be repeated by reusing the washing solution having been circulated and transported to the tank 11 (circulation washing). According to this method, it is possible to efficiently wash the filters until the filters are cleaned to a desired degree while circulating the washing solution.

In addition, the washing solution stored in the tank 11 may be introduced (arrow F3) into the distillation column 31 through the distillation column circulating pipe line 34 and the raw material injection pipe line 36, and after being distilled, the washing solution may be concentrated by a concentration device not shown in the drawing and circulated and transported (arrow F4) again to the tank 11 through the distillation pipe line 32. According to this method, not only the filters but also each of the pipe lines and liquid contact portions of the distillation column 31 can be washed together.

[Other Steps]

As long as the effects of the present invention are not impaired, the chemical liquid manufacturing method according to the embodiment of the present invention may have other steps in addition to the above steps. Examples of those other steps include a distillation step, an ion exchange step, and an electricity removing step.

<Distillation Step>

The distillation step means a step of distilling the liquid to be purified so as to remove impurities.

In an aspect, examples of the distillation column that can be used in the distillation step include a distillation column in which the contact portion thereof (the definition of the liquid contact portion will be described later) is formed of at least one kind of material selected from the group consisting of a nonmetallic material and an electropolished metallic material.

The aspects of the nonmetallic material and the electropolished metallic material will be described later.

<Ion Exchange Step>

The ion exchange step means a step of passing the liquid to be purified through an ion exchange unit. The method for passing the liquid to be purified through the ion exchange unit is not particularly limited, and examples thereof include a method of disposing an ion exchange unit in the middle of the pipe line of the chemical liquid manufacturing device described above and passing the organic solvent through the ion exchange unit with or without applying pressure thereto.

As the ion exchange unit, known ion exchange units can be used without particular limitation. Examples of the ion exchange unit include an ion exchange unit including a tower-like container storing an ion exchange resin, an ion adsorption membrane, and the like.

Examples of an aspect of the ion exchange step include a step in which a cation exchange resin or an anion exchange resin provided as a single bed is used as an ion exchange resin, a step in which a cation exchange resin and an anion exchange resin provided as a dual bed are used as an ion exchange resin, and a step in which a cation exchange resin and an anion exchange resin provided as a mixed bed are used as an ion exchange resin.

In order to reduce the amount of moisture eluted from the ion exchange resin, as the ion exchange resin, it is preferable to use a dry resin which does not contain moisture as far as possible. As the dry resin, commercial products can be used, and examples thereof include 15JS-HG•DRY (trade name, dry cation exchange resin, moisture: equal to or smaller than 2%) and MSPS2-1•DRY (trade name, mixed bed resin, moisture: equal to or smaller than 10%) manufactured by ORGANO CORPORATION, and the like. It is preferable that the ion exchange step is performed before the distillation step described above.

As another aspect of the ion exchange step, a step of using an ion adsorption membrane can be exemplified.

In a case where the ion adsorption membrane is used, a treatment can be performed at a high flow rate. The ion adsorption membrane is not particularly limited, and examples thereof include NEOSEPTA (trade name, manufactured by ASTOM Corporation), and the like.

It is preferable that the ion exchange step is performed after the distillation step described above. In a case where the ion exchange step is performed, it is possible to remove the impurities accumulated in the manufacturing device in a case where the impurities leak or to remove substances eluted from piping made of stainless steel (SUS) or the like used as a transfer pipe line.

<Electricity Removing Step>

The electricity removing step means a step of removing electricity from the liquid to be purified such that the charge potential thereof is reduced.

As the electricity removing method, known electricity removing methods can be used without particular limitation. Examples of the electricity removing method include a method for bringing the liquid to be purified into contact with a conductive material.

The contact time for which the liquid to be purified is brought into contact with a conductive material is preferably 0.001 to 60 seconds, more preferably 0.001 to 1 second, and even more preferably 0.01 to 0.1 seconds. Examples of the conductive material include stainless steel, gold, platinum, diamond, glassy carbon, and the like.

Examples of the method for bringing the liquid to be purified into contact with a conductive material include a method of disposing a grounded mesh formed of a conductive material in the interior of a pipe line and passing the liquid to be purified through the mesh, and the like.

The material of a liquid contact portion (the definition of the liquid contact portion will be described later) of the manufacturing device is not particularly limited. In view of obtaining a chemical liquid having a further improved defect inhibition performance, the liquid contact portion is preferably formed of at least one kind of material selected from the group consisting of a nonmetallic material and an electropolished metallic material. In the present specification, "liquid contact portion" is a portion which is likely to contact a fluid (for example, the inner surface of the tank, a feed pump, a packing, an O ring, the inner surface of the pipe line, or the like) and means an area ranging to a portion which is 100 nm below the surface thereof in a thickness direction.

Although there is no particular limitation, as the nonmetallic material, a polyethylene resin, a polypropylene resin, a polyethylene-polypropylene resin, or a fluorine-containing resin material such as a perfluoro resin is preferable. A fluorine-containing resin is more preferable because few metal atoms are eluted from this material.

Examples of the fluorine-containing resin include polytetrafluoroethylene (PTFE), a tetrafluoroethylene.perfluoroalkyl vinyl ether copolymer (PFA), a polytetrafluoroethylene-hexafluoropropylene copolymer resin (FEP), a polytetrafluoroethylene-ethylene copolymer resin (ETFE), a chlorotrifluoroethylene-ethylene copolymer resin (ECTFE), a vinylidene fluoride resin (PVDF), a chlorotrifluoroethylene copolymer resin (PCTFE), a vinyl fluoride resin (PVF), and the like.

As the fluorine-containing resin, polytetrafluoroethylene, a tetrafluoroethylene.perfluoroalkyl vinyl ether copolymer, or a polytetrafluoroethylene-hexafluoropropylene copolymer resin is preferable.

As the metallic material, known materials can be used without particular limitation.

Examples of the metallic material include a metallic material in which the total content of chromium and nickel with respect to the total mass of the metallic material is greater than 25% by mass. The total content of chromium and nickel is more preferably equal to or greater than 30% by mass. The upper limit of the total content of chromium and nickel in the metallic material is not particularly limited, but is preferably equal to or smaller than 90% by mass in general.

Examples of the metallic material include stainless steel, carbon steel, alloy steel, nickel-chromium-molybdenum steel, chromium steel, chromium-molybdenum steel, manganese steel, a nickel-chromium alloy, and the like.

As the stainless steel, known stainless steel can be used without particular limitation. Among these, an alloy with a nickel content equal to or higher than 8% by mass is preferable, and austenite-based stainless steel with a nickel content equal to or higher than 8% by mass is more preferable. Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

As the nickel-chromium alloy, known nickel-chromium alloys can be used without particular limitation. Among these, a nickel-chromium alloy is preferable in which the nickel content is 40% to 75% by mass and the chromium content is 1% to 30% by mass with respect to the total mass of the metallic material.

Examples of the nickel-chromium alloy include HASTELLOY (trade name, the same is true for the following description), MONEL (trade name, the same is true for the following description), INCONEL (trade name, the same is true for the following description), and the like. More specifically, examples thereof include HASTELLOY C-276 (Ni content: 63% by mass, Cr content: 16% by mass), HASTELLOY C (Ni content: 60% by mass, Cr content: 17% by mass), HASTELLOY C-22 (Ni content: 61% by mass, Cr content: 22% by mass), and the like.

Furthermore, if necessary, the nickel-chromium alloy may further contain boron, silicon, tungsten, molybdenum, copper, cobalt, and the like in addition to the aforementioned alloy.

As the method for electropolishing the metallic material, known methods can be used without particular limitation. For example, it is possible to use the methods described in paragraphs "0011" to "0014" in JP2015-227501A, paragraphs "0036" to "0042" in JP2008-264929A, and the like.

Presumably, in a case where the metallic material is electropolished, the chromium content in a passive layer on the surface thereof may become higher than the chromium content in the parent phase. Presumably, for this reason, from the distillation column in which the liquid contact portion is formed of an electropolished metallic material, the metal impurity containing metal atoms may not easily flow into the organic solvent, and hence an organic solvent having undergone distillation with a reduced impurity content can be obtained.

The metallic material may have undergone buffing. As the buffing method, known methods can be used without particular limitation. The size of abrasive grains used for finishing the buffing is not particularly limited, but is preferably equal to or smaller than #400 because such grains make it easy to further reduce the surface asperity of the metallic material. The buffing is preferably performed before the electropolishing.

In view of obtaining a chemical liquid having a further improved defect inhibition performance, the liquid contact portion is preferably formed of electropolished stainless steel. Particularly, in a case where the manufacturing device comprises a tank, the liquid contact portion of the tank is more preferably formed of electropolished stainless steel. The content mass ratio of a content of Cr to a content of Fe (hereinafter, referred to as "Cr/Fe" as well) in the liquid contact portion is not particularly limited. Generally, Cr/Fe is preferably 0.5 to 4. Particularly, in view of making it more difficult for the metal impurity and/or the organic impurity to be eluted into the treatment liquid, Cr/Fe is more preferably higher than 0.5 and lower than 3.5, and more preferably equal to or higher than 0.7 and equal to or lower than 3.0. In a case where Cr/Fe is higher than 0.5, the elution of a metal from the interior of the tank is more easily inhibited.

In a case where Cr/Fe is lower than 3.5, it becomes harder for the exfoliation of the liquid contact portion causing particles to occur.

The method for adjusting Cr/Fe in the metallic material is not particularly limited, and examples thereof include a method of adjusting the content of Cr atoms in the metallic material, a method of performing electropolishing such that the content of chromium in a passive layer on a polished surface becomes greater than the content of chromium in the parent phase, and the like.

A film technique may be applied to the metallic material.

The film technique is roughly classified into three types including metal coating (various plating techniques), inorganic coating (various chemical conversion treatments, glass, concrete, ceramics, and the like), and organic coating (anticorrosion oil, paint, rubber, and plastic).

As the film technique, for example, a surface treatment is preferable which is performed using anticorrosion oil, an anticorrosion agent, a corrosion inhibitor, a chelate compound, strippable plastic, a lining agent, and the like.

Particularly, it is preferable to use a surface treatment performed using corrosion inhibitors such as various carboxylic acids including chromate, nitrite, silicate, phosphoric acid, oleic acid, dimer acid, and nathenic acid, carboxylic acid metal soap, sulfonate, an amine salt, and an ester (a glycerin ester or a phosphoric acid ester of higher fatty acid); chelating compounds such as ethylenetetracarboxylic acid dianhydride, gluconic acid, nitrilotriacetic acid, hydroxyethyl ethylenediaminetriacetic acid, and diethylenetriamine pentaacetic acid; fluororesin lining, and the like. It is more preferable to use a phosphate treatment or a surface treatment performed using fluororesin lining.

[Clean Room]

It is preferable that all of the purification and manufacturing of the chemical liquid, the opening and/or washing of the container, the handling including storage of the solution, the treatment and analysis, and the measurement are performed in a clean room. It is preferable that the clean room meets the 14644-1 clean room standard. The clean room preferably meets any of International Organization for Standardization (ISO) class 1, ISO class 2, ISO class 3, or ISO class 4, more preferably meets ISO class 1 or ISO class 2, and even more preferably meets ISO class 1.

[Chemical Liquid]

The content of the organic solvent in the chemical liquid according to the present embodiment is not particularly limited, but is preferably 97.0% to 99.999% by mass, and more preferably 99.9% to 99.999% by mass in general. One kind of organic solvent may be used singly, or two or more kinds of solvents may be used in combination. In a case where two or more kinds of organic solvents are used in combination, the total content thereof is preferably within the above range.

In the present specification, an organic solvent means one liquid organic compound which is contained in the chemical liquid in an amount greater than 10,000 mass ppm with respect to the total mass of the chemical liquid. That is, in the present specification, a liquid organic compound contained in the chemical liquid in an amount greater than 10,000 mass ppm with respect to the total mass of the chemical liquid corresponds to an organic solvent.

In the present specification, "liquid" means that the compound stays in liquid form at 25° C. under atmospheric pressure.

The type of the organic solvents is not particularly limited, and known organic solvents can be used. Examples of the organic solvents include alkylene glycol monoalkyl ether carboxylate, alkylene glycol monoalkyl ether, a lactic acid alkyl ester, alkoxyalkyl propionate, cyclic lactone (preferably having 4 to 10 carbon atoms), a monoketone compound which may have a ring (preferably having 4 to 10 carbon atoms), alkylene carbonate, alkoxyalkyl acetate, alkyl pyruvate, and the like.

Furthermore, as the organic solvents, those described in JP2016-057614A, JP2014-219664A, JP2016-138219A, and JP2015-135379A may be used.

The chemical liquid preferably contains at least one kind of organic solvent selected from the group consisting of propylene glycol monomethyl ether (PGME), propylene glycol monoethyl ether (PGEE), propylene glycol monopropyl ether (PGPE), propylene glycol monomethyl ether acetate (PGMEA), ethyl lactate (EL), methyl methoxypropionate (MPM), cyclopentanone (CyPn), cyclohexanone (CyHe), γ-butyrolactone (GBL), diisoamyl ether (DIAE), butyl acetate (nBA), isoamyl acetate (iAA), isopropanol (IPA), and 4-methyl-2-pentanol (MIBC), and more preferably contains at least one kind of organic solvent selected from the group consisting of propylene glycol monomethyl ether (PGME), propylene glycol monomethyl ether acetate (PGMEA), ethyl lactate (EL), methyl methoxypropionate (MPM), cyclohexanone (CyHe), γ-butyrolactone (GBL), butyl acetate (nBA), isoamyl acetate (iAA), isopropanol (IPA), and 4-methyl-2-pentanol (MIBC). One kind of organic solvent may be used singly, or two or more kinds of organic solvents may be used in combination.

The chemical liquid may contain other components in addition to the organic solvent. Examples of those other components include a metal impurity, an organic impurity, a surfactant, water, and the like.

[Metal Impurity]

It is preferable that the chemical liquid contains a metal impurity. In the present specification, the metal impurity means the total content of metal-containing particles and metal-containing ions. For measuring the content of the metal-containing particles and the metal-containing ions in the chemical liquid, it is possible to use Agilent 8800 triple quadrupole ICP-MS (for semiconductor analysis, option #200). The measurement condition is as described in Examples.

<Metal-Containing Particles>

The content of the metal-containing particles in the chemical liquid is not particularly limited. Generally, the total content of the metal-containing particles with respect to the total mass of the chemical liquid is preferably 0.1 to 40 mass ppt, more preferably 1 to 25 mass ppt, even more preferably 1 to 17 mass ppt, and particularly preferably 1 to 13 mass ppt. The chemical liquid may contain only one kind of metal-containing particles or two or more kinds of metal-containing particles. In a case where the chemical liquid contains two or more kinds of metal-containing particles, the total content thereof is preferably within the above range.

Particularly, in a case where the chemical liquid contains one kind of specific metal particles among the metal-containing particles, the content of one kind of the particles in the chemical liquid with respect to the total mass of the chemical liquid is preferably equal to or smaller than 15 mass ppt, more preferably equal to or smaller than 10 mass ppt, even more preferably equal to or smaller than 7 mass ppt, and particularly preferably equal to or smaller than 3 mass ppt. The lower limit thereof is not particularly limited, but is preferably equal to or greater than 0.01 mass ppt in general. In a case where the content of the above particles in the chemical liquid is equal to or greater than 0.01 mass ppt, various impurities occurring on a semiconductor substrate are more easily aggregated in the photolithography process, and defects hardly occur. As a result, it is more difficult for short to occur in the obtained semiconductor substrate.

In a case where the chemical liquid contains two or more kinds of specific metal particles among the metal-containing particles, the total content of two or more kinds of the particles in the chemical liquid with respect to the total mass of the chemical liquid is preferably equal to or smaller than 15 mass ppt, more preferably equal to or smaller than 10 mass ppt, even more preferably equal to or smaller than 7 mass ppt, and particularly preferably equal to or smaller than 3 mass ppt. The lower limit thereof is not particularly limited, but is preferably equal to or greater than 0.01 mass ppt in general. In a case where the content of the above particles in the chemical liquid is equal to or greater than 0.01 mass ppt, impurities occurring on a semiconductor substrate are more easily aggregated in the photolithography process, and defects hardly occur. As a result, it is more difficult for short to occur in the obtained semiconductor substrate.

By performing an examination, the inventors of the present invention have found that the specific metals (particles and ions, particularly, particles) easily form a conductive complex by wrapping various impurities in a photolithography process. Particularly, in a case where the content of the specific metal particles in the chemical liquid is set to be equal to or smaller than a desired range, the chemical liquid has a further improved short occurrence inhibition performance.

<Metal-Containing Ions>

The content of the metal-containing ions in the chemical liquid is not particularly limited. Generally, the total content of the metal-containing ions with respect to the total mass of the chemical liquid is preferably 0.1 to 45 mass ppt, more preferably 1 to 24 mass ppt, and even more preferably 2 to 10 mass ppt. The chemical liquid may contain only one kind of metal-containing ions or two or more kinds of metal-containing ions. In a case where the chemical liquid contains two or more kinds of metal-containing ions, the total content thereof is preferably within the above range.

Particularly, in a case where the chemical liquid contains one kind of specific metal ions among the metal-containing ions, in view of obtaining a chemical liquid having a further improved effect of the present invention, the content of one kind of the ions in the chemical liquid with respect to the total mass of the chemical liquid is preferably equal to or smaller than 15 mass ppt, more preferably equal to or smaller than 11 mass ppt, and even more preferably equal to or smaller than 8 mass ppt. The lower limit thereof is not particularly limited, but is preferably equal to or greater than 0.1 mass ppt in general. In a case where the content of the above ions in the chemical liquid is equal to or greater than 0.1 mass ppt, impurities occurring on a semiconductor substrate are more easily aggregated in the photolithography process, and defects hardly occur. As a result, it is more difficult for short to occur in the obtained semiconductor substrate.

Particularly, in a case where the chemical liquid contains two or more kinds of specific metal ions among the metal-containing ions, the total content of two or more kinds of the ions in the chemical liquid with respect to the total mass of the chemical liquid is preferably equal to or smaller than 15 mass ppt, more preferably equal to or smaller than 11 mass ppt, and even more preferably equal to or smaller than 8 mass ppt. The lower limit thereof is not particularly limited, but is preferably equal to or greater than 0.1 mass ppt in general. In a case where the total content of the above ions in the chemical liquid is equal to or greater than 0.1 mass ppt, various impurities occurring on a semiconductor substrate are more easily aggregated in a photolithography process, and defects hardly occur. As a result, it is more difficult for short to occur in the obtained semiconductor substrate.

[Organic Impurity]

The chemical liquid may contain an organic impurity. The definition of the organic impurity, the method for measuring the content of the organic impurity in the chemical liquid, and preferred aspects of the organic impurity are as described above.

The content of the organic impurity in the chemical liquid is not particularly limited. In view of obtaining a chemical liquid having a further improved effect of the present invention, the content of the organic impurity with respect to the total mass of the chemical liquid is preferably equal to or smaller than 30 mass ppm, more preferably equal to or smaller than 10 mass ppm, even more preferably equal to or smaller than 3 mass ppm, and still more preferably equal to or smaller than 1.9 mass ppm. The lower limit thereof is not particularly limited, but it is preferable that the chemical liquid does not contain the organic impurity. In a case where the chemical liquid contains the organic impurity, the organic impurity functions as a ligand for a metal and forms a complex with the metal. This type of complex is highly hydrophobic and easily remain on the surface of a semiconductor substrate treated with the chemical liquid. Presumably, as a result, the complex containing the metal may remain on the semiconductor substrate and cause short between wirings.

[Container]

The chemical liquid may be temporarily stored in a container until the chemical liquid is used. As the container for storing the chemical liquid, known containers can be used without particular limitation.

As the container storing the chemical liquid, a container for a semiconductor is preferable which has high internal cleanliness and hardly causes elution of impurities.

Examples of the usable container specifically include a "CLEAN BOTTLE" series manufactured by AICELLO CORPORATION, "PURE BOTTLE" manufactured by KODAMA PLASTICS Co., Ltd., and the like, but the container is not limited to these.

As the container, for the purpose of preventing mixing of impurities into the raw materials and the chemical liquid (contamination), it is also preferable to use a multilayer bottle in which the inner wall of the container has a 6-layer structure formed of 6 kinds of resins or a multilayer bottle having a 7-layer structure formed of 6 kinds of resins. Examples of these containers include the containers described in JP2015-123351A.

It is preferable that the liquid contact portion of the container is formed of a nonmetallic material or stainless steel.

Examples of the nonmetallic material include the materials exemplified above as nonmetallic materials used in the liquid contact portion of the distillation column.

Particularly, in a case where a container in which the liquid contact portion is formed of polyfluorocarbon is used among the above containers, the occurrence of a problem such as elution of an ethylene or propylene oligomer can be further inhibited than in a case where a container, in which the liquid contact portion is formed of a polyethylene resin, a polypropylene resin, or a polyethylene-polypropylene resin, is used.

Specific examples of the container in which the liquid contact portion is formed of a fluororesin include FluoroPure PFA composite drum manufactured by Entegris, Inc., and the like. Furthermore, it is possible to use the containers described on p. 4 in JP1991-502677A (JP-H03-502677A), p. 3 in WO2004/016526A, p. 9 and p. 16 in WO99/046309A, and the like. In a case where the nonmetallic material is used for the liquid contact portion, it is preferable to inhibit the elution of the nonmetallic material into the chemical liquid.

For the container, the liquid contact portion contacting the chemical liquid is preferably formed of stainless steel, and more preferably formed of electropolished stainless steel.

In a case where the chemical liquid is stored in such a container, it is more difficult for the impurity metal and/or the organic impurity to be eluted into the chemical liquid stored in the container.

The aspect of the stainless steel is as described above as the material of the liquid contact portion of the distillation column. The aspect of the electropolished stainless steel is as described above as well.

In the stainless steel forming the liquid contact portion of the container, the content mass ratio of the content of Cr atoms to the content of Fe atoms (hereinafter, described as "Cr/Fe" as well) is not particularly limited, but is preferably 0.5 to 4 in general. Particularly, in view of making it more difficult for either or both of the impurity metal and organic impurity to be eluted in the chemical liquid stored in the container, Cr/Fe is more preferably higher than 0.5 and less than 3.5. In a case where Cr/Fe is higher than 0.5, the elution of a metal from the interior of the container can be inhibited. In a case where Cr/Fe is less than 3.5, the exfoliation of an inner container causing particles and the like hardly occurs.

The method for adjusting Cr/Fe in the stainless steel is not particularly limited, and examples thereof include a method of adjusting the content of Cr atoms in the stainless steel, a method of performing electropolishing such that the chromium content in a passive layer on a polished surface becomes higher than the chromium content in the parent phase, and the like.

It is preferable that the interior of the aforementioned container is washed before the solution is stored into the container. As a liquid used for washing, the washing solution described above, the chemical liquid itself, or a liquid obtained by diluting the chemical liquid is preferable. After being manufactured, the chemical liquid may be bottled using a container such as a gallon bottle or a quart bottle, transported, and stored. The gallon bottle may be formed of a glass material or other materials.

In order to prevent the change of the components in the solution during storage, purging may be performed in the interior of the container by using an inert gas (nitrogen, argon, or the like) having a purity equal to or higher than 99.99995% by volume. Particularly, a gas with small moisture content is preferable. The temperature at the time of transport and storage may be room temperature. However, in order to prevent alteration, the temperature may be controlled within a range of −20° C. to 30° C.

[Use of Chemical Liquid]

The chemical liquid according to the above embodiment is preferably used for manufacturing semiconductors. Specifically, in a semiconductor device manufacturing process including a lithography step, an etching step, an ion implantation step, a peeling step, and the like, the chemical liquid is used for treating an organic substance after each step is finished or before the next step is started. Specifically, the chemical liquid is suitably used as a prewet solution, a developer, a rinsing solution, a peeling solution, and the like.

For example, the chemical liquid can also be used for rinsing of edge line of semiconductor substrates before and after the coating with resist.

Furthermore, the chemical liquid can also be used as a diluent of a resin contained in a resist solution (which will be described later). Furthermore, the chemical liquid may be diluted with another organic solvent and/or water, and the like.

The chemical liquid can also be suitably used for other uses in addition to the manufacturing of semiconductors. The chemical liquid can be used as a developer, a rinsing solution, and the like of polyimide, a resist for a sensor, a resist for a lens, and the like.

In addition, the chemical liquid can also be used as a solvent for medical uses or for washing. Particularly, the chemical liquid can be suitably used for washing containers, piping, substrates (for example, a wafer and glass), and the like.

Particularly, the chemical liquid manufactured by the chemical liquid manufacturing method according to the above embodiment is more preferably used for pre-wetting. That is, it is preferable that the chemical liquid manufactured by the chemical liquid manufacturing method according to the above embodiment is used as a prewet solution.

EXAMPLES

Hereinafter, the present invention will be more specifically described based on examples. The materials, the amount and proportion of the materials used, the details of treatments, the procedure of treatments, and the like shown in the following examples can be appropriately modified as long as the gist of the present invention is maintained. Accordingly, the scope of the present invention is not limited to the following examples.

[Manufacturing of Chemical Liquid]

By using the chemical liquid manufacturing device shown in FIG. 3, chemical liquids were manufactured by purifying organic solvents.

For purifying each of the chemical liquids, each of the filters described in Table 1 was used. Each of the filters was washed by the method described in Table 1.

Then, each of the filters was brought into contact with 1,500 ml of each of the organic solvents (described in the column of "Test liquid" in the table) described in Table 1 for 24 hours at 23° C., thereby obtaining a test liquid.

The content of metal particles, the content of metal-containing ions, and the content of an organic impurity in the obtained test liquid were measured by the method which will be described later. The results are described in the respective columns of Table 1.

Thereafter, each of the washed filters was mounted on the chemical liquid manufacturing device shown in FIG. 3, and the organic solvents were purified under the condition described in Table 1.

For each of the chemical liquids obtained in this way, the content of metal particles, the content of metal-containing ions, and the content of an organic impurity in the chemical liquid were measured by the method which will be described later.

At the time of manufacturing the chemical liquids according to examples and a comparative example, as each of the washing solutions and the organic solvents described in Table 1, high-purity grade products with purity equal to or higher than 99% by mass were used.

The abbreviations for the filters used for purifying the chemical liquids of examples and comparative examples are as below. "First filter", "second filter", and "third filter" are filters mounted on the filtering devices 14 in this order from the pump 15 side in the chemical liquid manufacturing device shown in FIG. 3.

- Nylon (5 nm): manufactured by Entegris, Inc., material: nylon, pore size: 5 nm, corresponding to hydrophilic filter
- PE (5 nm): manufactured by Entegris, Inc., material: polyethylene, pore size: 5 nm, corresponding to hydrophobic filter
- PTFE (10 nm): manufactured by Entegris, Inc., material: polytetrafluoroethylene, pore size: 10 nm, corresponding to hydrophobic filter
- PTFE (20 nm): manufactured by Entegris, Inc., material: polytetrafluoroethylene, pore size: 20 nm, corresponding to hydrophobic filter
- IEX-PTFE (10 nm) sulfuric acid: 10 nm IEXPTFE manufactured by Entegris, Inc. (filter with a pore size of 10 nm containing a sulfo group on the surface of a base material made of polytetrafluoroethylene, corresponding to a metal ion adsorption filter and a hydrophilic filter)
- IEX-PTFE (10 nm) Imido: 10 nm IEXPTFE manufactured by Entegris, Inc. (filter with a pore size of 10 nm containing an imido group on the surface of a base material made of polytetrafluoroethylene, corresponding to a metal ion adsorption filter and a hydrophilic filter)
- IEX-PTFE (10 nm) carboxylic acid: 10 nm IEXPTFE manufactured by Entegris, Inc. (filter with a pore size of 10 nm containing a carboxy group on the surface of a base material made of polytetrafluoroethylene, corresponding to a metal ion adsorption filter and a hydrophilic filter)
- HDPE (10 nm): manufactured by Entegris, Inc., material: high-density polyethylene, pore size: 10 nm, corresponding to hydrophobic filter
- PP (20 nm): manufactured by Entegris, Inc., material: polypropylene, pore size: 20 nm, corresponding to hydrophobic filter
- HDPE (3 nm): manufactured by Entegris, Inc., material: high-density polyethylene, pore size: 3 nm, corresponding to hydrophobic filter
- UPE (3 nm): manufactured by Entegris, Inc., material: ultra-high-molecular-weight polyethylene, pore size: 3 nm, corresponding to hydrophobic filter The abbreviations for the washing solutions and the organic solvents in the table are as below.
- CyHe: cyclohexanone
- DMSO: dimethyl sulfoxide
- NMP: n-methyl pyrrolidone
- DEG: diethylene glycol
- EG: ethylene glycol
- DPG: dipropylene glycol
- PG: propylene glycol
- EC: ethylene carbonate
- PC: propylene carbonate
- Sulfolane: sulfolane
- CyPn: cyclopenatnone
- MAK: 2-heptanone
- GBL: γ-butyrolactone
- PGMEA: propylene glycol monomethyl ether acetate
- PGME: propylene glycol monomethyl ether
- PGEE: propylene glycol monoethyl ether
- PGPE: propylene glycol monopropyl ether
- EL: ethyl lactate
- MPM: methyl methoxypropionate
- DIRE: diisoamyl ether
- nBA: butyl acetate
- iAA: isoamyl acetate
- IPA: isopropanol
- MIBC: 4-methyl-2-pentanol <Method for Measuring Content of Metal Particles and the Like in Test Liquid and Chemical Liquid>

The content of metal particles and the content of metal-containing ions in the test liquids and the chemical liquids according to the examples and comparative examples were measured by the following method.

For the measurement, Agilent 8800 triple quadrupole ICP-MS (for semiconductor analysis, option #200) was used. With this measurement apparatus, metals in each of the measurement sample can be classified into metals as particles and metals other than those (for examples, ions and the like), and the content of the metals as particles and the content of metals other than those can be measured.

Measurement Condition

As a sample introduction system, a quartz torch, a coaxial perfluoroalkoxyalkane (PFA) nebulizer (for self-suction), and a platinum interface cone were used. The measurement parameters of cool plasma conditions are as below.
- Output of Radio Frequency (RF) (W): 600
- Flow rate of carrier gas (L/min): 0.7
- Flow rate of makeup gas (L/min): 1
- Sampling depth (mm): 18

<Content of Organic Impurity in Test Liquid and Chemical Liquid>

The content of the organic impurity in the test liquids and the chemical liquids was measured using a gas chromatography mass spectrometer (trade name "GCMS-2020", manufactured by Shimadzu Corporation, the measurement conditions were as described below).

(Measurement Condition)
- Capillary column: InertCap 5 MS/NP 0.25 mmI.D.×30 m df=0.25 μm
- Sample introduction method: split 75 kPa constant pressure
- Vaporizing chamber temperature: 230° C.
- Column oven temperature: 80° C. (2 min)-500° C. (13 min) heating rate 15° C./min
- Carrier gas: helium
- Septum purge flow rate: 5 mL/min
- Split ratio: 25:1
- Interface temperature: 250° C.
- Ion source temperature: 200° C.
- Measurement mode: Scan m/z=85~500
- Amount of sample introduced: 1 μL As a result of measuring the content of the organic impurity in the test liquids and the chemical liquids by the method described above, it was found that all of the chemical liquids contained at least one kind of organic impurity selected from the group consisting of Formulae (1) to (7).

[Short Occurrence Inhibition Performance]

The short occurrence inhibition performance of the obtained chemical liquids was measured by the following method.

By using each of the chemical liquids described in the examples and the comparative examples, a Metal-Oxide-Semiconductor Field-Effect Transistor (MOSFET)-type test substrate was prepared by a photoresist process. For the obtained test substrate, a Time Dependent Dielectric Breakdown (TDDB) test was performed, and the short occurrence inhibition performance of the chemical liquid was evaluated. Specifically, in an environment with 25° C., constant current density of 20 mA/cm$^2$ was applied to the test substrate, and the total quantity of electric charge $Q_{bd}$ [unit: C/cm$^2$] that was applied until the dielectric breakdown of a gate insulating film occurred was measured. The result was evaluated based on the following standards and described in Table 1.

AA: the total quantity of electric charge $Q_{bd}$ was equal to or greater than 60 [C/cm$^2$].

A: the total quantity of electric charge $Q_{bd}$ was equal to or greater than 50 [C/cm$^2$] and less than 60 [C/cm$^2$].

B: the total quantity of electric charge $Q_{bd}$ was equal to or greater than 40 [C/cm$^2$] and less than 50 [C/cm$^2$].

C: the total quantity of electric charge $Q_{bd}$ was equal to or greater than 30 [C/cm$^2$] and less than 40 [C/cm$^2$].

D: the total quantity of electric charge $Q_{bd}$ was less than 30 [C/cm$^2$].

TABLE 1

| | Washing condition for filter | | | |
|---|---|---|---|---|
| | Washing solution | | | |
| | Type | Solubility parameter (MPa)$^{0.5}$ | Washing method | Test liquid |
| Example 1 | CyHe | 19.6 | Passing washing solution through filter, immersing filter into washing solution, and the like; the filter was washed by appropriately setting the washing method, the number of times the washing solution was circulated, and the like in each of the examples and the comparative examples. | CyHe |
| Example 2 | CyHe | 19.6 | | CyHe |
| Example 3 | CyHe | 19.6 | | CyHe |
| Example 4 | DMSO | 26.7 | | CyHe |
| Example 5 | NMP | 23 | | CyHe |
| Example 6 | DEG | 29.1 | | CyHe |
| Example 7 | EG | 28.5 | | CyHe |
| Example 8 | DPG | 31.2 | | CyHe |
| Example 9 | PG | 30.2 | | CyHe |
| Example 10 | EC | 29.6 | | CyHe |
| Example 11 | PC | 27.6 | | CyHe |
| Example 12 | Sulfolane | 25.9 | | CyHe |
| Example 13 | CyPn | 18.9 | | CyHe |
| Example 14 | CyHe | 19.5 | | CyHe |
| Example 15 | MAK | 21.2 | | CyHe |
| Example 16 | GBL | 25.5 | | CyHe |
| Example 17 | CyHe | 19.6 | | CyHe |
| Example 18 | CyHe | 19.6 | | CyHe |
| Example 19 | CyHe | 19.6 | | PGME |
| Example 20 | CyHe | 19.6 | | PGEE |
| Example 21 | CyHe | 19.6 | | PGPE |
| Example 22 | CyHe | 19.6 | | PGMEA |
| Example 23 | CyHe | 19.6 | | EL |
| Example 24 | CyHe | 19.6 | | MPM |
| Example 25 | CyHe | 19.6 | | CyPn |
| Example 26 | CyHe | 19.6 | | GBL |
| Example 27 | CyHe | 19.6 | | DIAE |
| Example 28 | CyHe | 19.6 | | nBA |
| Example 29 | CyHe | 19.6 | | iAA |
| Example 30 | CyHe | 19.6 | | IPA |
| Example 31 | CyHe | 19.6 | | PGMEA/PGME (7/3) |
| Example 32 | CyHe | 19.6 | | MIBC |
| Example 33 | PGMEA | 18.2 | | CyHe |
| Example 34 | PGMEA/PGME(7/3) | 18.6 | | CyHe |
| Example 35 | CyHe | 19.6 | | CyHe |
| Example 36 | CyHe | 19.6 | | CyHe |
| Example 37 | CyHe | 19.6 | | CyHe |
| Example 38 | CyHe | 19.6 | | CyHe |
| Example 39 | CyHe | 19.6 | | CyHe |
| Example 40 | CyHe | 19.6 | | CyHe |
| Example 41 | CyHe | 19.6 | | CyHe |
| Example 42 | CyHe | 19.6 | | CyHe |

| | Test result relating to washed first filter Content of metal particles in test liquid (with respect to total mass of test liquid) | | | | | | |
|---|---|---|---|---|---|---|---|
| | Total content (based on mass) | Content of particles containing specific metal (based on mass) | | | | | |
| | | Fe | Al | Cr | Ni | Ti | Total |
| Example 1 | 3.0 ppt | 0.30 ppt | 0.25 ppt | 0.10 ppt | 0.13 ppt | 0.20 ppt | 0.98 ppt |
| Example 2 | 5.0 ppt | 0.50 ppt | 0.42 ppt | 0.17 ppt | 0.22 ppt | 0.33 ppt | 1.64 ppt |
| Example 3 | 4.0 ppt | 0.40 ppt | 0.33 ppt | 0.13 ppt | 0.17 ppt | 0.26 ppt | 1.29 ppt |
| Example 4 | 3.5 ppt | 0.35 ppt | 0.29 ppt | 0.12 ppt | 0.15 ppt | 0.23 ppt | 1.14 ppt |
| Example 5 | 3.0 ppt | 0.30 ppt | 0.25 ppt | 0.10 ppt | 0.13 ppt | 0.20 ppt | 0.98 ppt |
| Example 6 | 3.5 ppt | 0.35 ppt | 0.29 ppt | 0.12 ppt | 0.15 ppt | 0.23 ppt | 1.14 ppt |
| Example 7 | 4.5 ppt | 0.45 ppt | 0.38 ppt | 0.15 ppt | 0.20 ppt | 0.29 ppt | 1.47 ppt |

TABLE 1-continued

| | | | | | | | |
|---|---|---|---|---|---|---|---|
| Example 8 | 4.0 ppt | 0.40 ppt | 0.33 ppt | 0.13 ppt | 0.17 ppt | 0.26 ppt | 1.29 ppt |
| Example 9 | 3.5 ppt | 0.35 ppt | 0.29 ppt | 0.12 ppt | 0.15 ppt | 0.23 ppt | 1.14 ppt |
| Example 10 | 3.0 ppt | 0.30 ppt | 0.25 ppt | 0.10 ppt | 0.13 ppt | 0.20 ppt | 0.98 ppt |
| Example 11 | 2.5 ppt | 0.25 ppt | 0.21 ppt | 0.08 ppt | 0.11 ppt | 0.16 ppt | 0.81 ppt |
| Example 12 | 4.0 ppt | 0.40 ppt | 0.33 ppt | 0.13 ppt | 0.17 ppt | 0.26 ppt | 1.29 ppt |
| Example 13 | 4.5 ppt | 0.45 ppt | 0.38 ppt | 0.15 ppt | 0.20 ppt | 0.29 ppt | 1.47 ppt |
| Example 14 | 2.0 ppt | 0.20 ppt | 0.17 ppt | 0.07 ppt | 0.09 ppt | 0.13 ppt | 0.66 ppt |
| Example 15 | 3.0 ppt | 0.30 ppt | 0.25 ppt | 0.10 ppt | 0.13 ppt | 0.20 ppt | 0.98 ppt |
| Example 16 | 3.5 ppt | 0.35 ppt | 0.29 ppt | 0.12 ppt | 0.15 ppt | 0.23 ppt | 1.14 ppt |
| Example 17 | 3.5 ppt | 0.35 ppt | 0.29 ppt | 0.12 ppt | 0.15 ppt | 0.23 ppt | 1.14 ppt |
| Example 18 | 3.0 ppt | 0.30 ppt | 0.25 ppt | 0.10 ppt | 0.13 ppt | 0.20 ppt | 0.98 ppt |
| Example 19 | 4.5 ppt | 0.45 ppt | 0.38 ppt | 0.15 ppt | 0.20 ppt | 0.29 ppt | 1.47 ppt |
| Example 20 | 7.5 ppt | 0.75 ppt | 0.63 ppt | 0.25 ppt | 0.33 ppt | 0.49 ppt | 2.45 ppt |
| Example 21 | 6.0 ppt | 0.60 ppt | 0.50 ppt | 0.20 ppt | 0.26 ppt | 0.39 ppt | 1.95 ppt |
| Example 22 | 5.3 ppt | 0.53 ppt | 0.44 ppt | 0.18 ppt | 0.23 ppt | 0.34 ppt | 1.72 ppt |
| Example 23 | 4.5 ppt | 0.45 ppt | 0.38 ppt | 0.15 ppt | 0.20 ppt | 0.29 ppt | 1.47 ppt |
| Example 24 | 5.3 ppt | 0.53 ppt | 0.44 ppt | 0.18 ppt | 0.23 ppt | 0.34 ppt | 1.72 ppt |
| Example 25 | 6.8 ppt | 0.68 ppt | 0.56 ppt | 0.23 ppt | 0.29 ppt | 0.44 ppt | 2.20 ppt |
| Example 26 | 6.0 ppt | 0.60 ppt | 0.50 ppt | 0.20 ppt | 0.26 ppt | 0.39 ppt | 1.95 ppt |
| Example 27 | 5.3 ppt | 0.53 ppt | 0.44 ppt | 0.18 ppt | 0.23 ppt | 0.34 ppt | 1.72 ppt |
| Example 28 | 4.5 ppt | 0.45 ppt | 0.38 ppt | 0.15 ppt | 0.20 ppt | 0.29 ppt | 1.47 ppt |
| Example 29 | 3.8 ppt | 0.38 ppt | 0.31 ppt | 0.13 ppt | 0.16 ppt | 0.24 ppt | 1.22 ppt |
| Example 30 | 6.0 ppt | 0.60 ppt | 0.50 ppt | 0.20 ppt | 0.26 ppt | 0.39 ppt | 1.95 ppt |
| Example 31 | 6.8 ppt | 0.68 ppt | 0.56 ppt | 0.23 ppt | 0.29 ppt | 0.44 ppt | 2.20 ppt |
| Example 32 | 3.0 ppt | 0.30 ppt | 0.25 ppt | 0.10 ppt | 0.13 ppt | 0.20 ppt | 0.98 ppt |
| Example 33 | 4.5 ppt | 0.45 ppt | 0.38 ppt | 0.15 ppt | 0.20 ppt | 0.29 ppt | 1.47 ppt |
| Example 34 | 5.0 ppt | 0.50 ppt | 0.42 ppt | 0.17 ppt | 0.22 ppt | 0.33 ppt | 1.64 ppt |
| Example 35 | 5.0 ppt | 0.50 ppt | 0.42 ppt | 0.17 ppt | 0.22 ppt | 0.33 ppt | 1.64 ppt |
| Example 36 | 4.5 ppt | 0.45 ppt | 0.38 ppt | 0.15 ppt | 0.20 ppt | 0.29 ppt | 1.47 ppt |
| Example 37 | 2.5 ppt | 0.25 ppt | 0.21 ppt | 0.08 ppt | 0.11 ppt | 0.16 ppt | 0.81 ppt |
| Example 38 | 1.5 ppt | 0.15 ppt | 0.13 ppt | 0.05 ppt | 0.07 ppt | 0.10 ppt | 0.50 ppt |
| Example 39 | 2.0 ppt | 0.20 ppt | 0.17 ppt | 0.07 ppt | 0.09 ppt | 0.13 ppt | 0.66 ppt |
| Example 40 | 3.0 ppt | 0.30 ppt | 0.25 ppt | 0.10 ppt | 0.13 ppt | 0.20 ppt | 0.98 ppt |
| Example 41 | 2.5 ppt | 0.25 ppt | 0.21 ppt | 0.08 ppt | 0.11 ppt | 0.16 ppt | 0.81 ppt |
| Example 42 | 2.0 ppt | 0.20 ppt | 0.17 ppt | 0.07 ppt | 0.09 ppt | 0.13 ppt | 0.66 ppt |

| | Test result relating to washed first filter | | | | | | | |
|---|---|---|---|---|---|---|---|---|
| | Content of metal particles in test liquid (with respect to total mass of test liquid) | | | | | | | organic impurity |
| | Total content (based on mass) | Content of particles containing specific metal (based on mass) | | | | | | in test liquid (mass ppm) |
| | | Fe | Al | Cr | Ni | Ti | Total | |
| Example 1 | 6.0 ppt | 0.60 ppt | 0.50 ppt | 0.20 ppt | 0.26 ppt | 0.39 ppt | 1.95 ppt | 1.0 |
| Example 2 | 10 ppt | 1.00 ppt | 0.83 ppt | 0.33 ppt | 0.43 ppt | 0.65 ppt | 3.24 ppt | 2.8 |
| Example 3 | 8.0 ppt | 0.80 ppt | 0.67 ppt | 0.27 ppt | 0.35 ppt | 0.52 ppt | 2.61 ppt | 1.3 |
| Example 4 | 7.0 ppt | 0.70 ppt | 0.58 ppt | 0.23 ppt | 0.30 ppt | 0.46 ppt | 2.27 ppt | 1.2 |
| Example 5 | 6.0 ppt | 0.60 ppt | 0.50 ppt | 0.20 ppt | 0.26 ppt | 0.39 ppt | 1.95 ppt | 1.0 |
| Example 6 | 7.0 ppt | 0.70 ppt | 0.58 ppt | 0.23 ppt | 0.30 ppt | 0.46 ppt | 2.27 ppt | 1.2 |
| Example 7 | 9.0 ppt | 0.90 ppt | 0.75 ppt | 0.30 ppt | 0.39 ppt | 0.59 ppt | 2.93 ppt | 1.5 |
| Example 8 | 8.0 ppt | 0.80 ppt | 0.67 ppt | 0.27 ppt | 0.35 ppt | 0.52 ppt | 2.61 ppt | 1.3 |
| Example 9 | 7.0 ppt | 0.70 ppt | 0.58 ppt | 0.23 ppt | 0.30 ppt | 0.46 ppt | 2.27 ppt | 1.2 |
| Example 10 | 6.0 ppt | 0.60 ppt | 0.50 ppt | 0.20 ppt | 0.26 ppt | 0.39 ppt | 1.95 ppt | 1.0 |
| Example 11 | 5.0 ppt | 0.50 ppt | 0.42 ppt | 0.17 ppt | 0.22 ppt | 0.33 ppt | 1.64 ppt | 0.8 |
| Example 12 | 8.0 ppt | 0.80 ppt | 0.67 ppt | 0.27 ppt | 0.35 ppt | 0.52 ppt | 2.61 ppt | 1.3 |
| Example 13 | 9.0 ppt | 0.90 ppt | 0.75 ppt | 0.30 ppt | 0.39 ppt | 0.59 ppt | 2.93 ppt | 1.5 |
| Example 14 | 4.0 ppt | 0.40 ppt | 0.33 ppt | 0.13 ppt | 0.17 ppt | 0.26 ppt | 1.29 ppt | 0.67 |
| Example 15 | 6.0 ppt | 0.60 ppt | 0.50 ppt | 0.20 ppt | 0.26 ppt | 0.39 ppt | 1.95 ppt | 1.0 |
| Example 16 | 7.0 ppt | 0.70 ppt | 0.58 ppt | 0.23 ppt | 0.30 ppt | 0.46 ppt | 2.27 ppt | 1.2 |
| Example 17 | 7.0 ppt | 0.70 ppt | 0.58 ppt | 0.23 ppt | 0.30 ppt | 0.46 ppt | 2.27 ppt | 1.2 |
| Example 18 | 6.0 ppt | 0.60 ppt | 0.50 ppt | 0.20 ppt | 0.26 ppt | 0.39 ppt | 1.95 ppt | 1.0 |
| Example 19 | 7.2 ppt | 0.72 ppt | 0.60 ppt | 0.24 ppt | 0.31 ppt | 0.47 ppt | 2.34 ppt | 1.1 |
| Example 20 | 12.0 ppt | 1.20 ppt | 1.00 ppt | 0.40 ppt | 0.52 ppt | 0.78 ppt | 3.90 ppt | 2.9 |
| Example 21 | 9.6 ppt | 0.96 ppt | 0.80 ppt | 0.32 ppt | 0.42 ppt | 0.62 ppt | 3.12 ppt | 1.4 |
| Example 22 | 8.4 ppt | 0.84 ppt | 0.70 ppt | 0.28 ppt | 0.37 ppt | 0.55 ppt | 2.74 ppt | 1.2 |
| Example 23 | 7.2 ppt | 0.72 ppt | 0.60 ppt | 0.24 ppt | 0.31 ppt | 0.47 ppt | 2.34 ppt | 1.1 |
| Example 24 | 8.4 ppt | 0.84 ppt | 0.70 ppt | 0.28 ppt | 0.37 ppt | 0.55 ppt | 2.74 ppt | 1.2 |
| Example 25 | 10.8 ppt | 1.08 ppt | 0.90 ppt | 0.36 ppt | 0.47 ppt | 0.70 ppt | 3.51 ppt | 1.6 |
| Example 26 | 9.6 ppt | 0.96 ppt | 0.80 ppt | 0.32 ppt | 0.42 ppt | 0.62 ppt | 3.12 ppt | 1.4 |
| Example 27 | 8.4 ppt | 0.84 ppt | 0.70 ppt | 0.28 ppt | 0.37 ppt | 0.55 ppt | 2.74 ppt | 1.2 |
| Example 28 | 7.2 ppt | 0.72 pot | 0.60 ppt | 0.24 ppt | 0.31 ppt | 0.47 ppt | 2.34 ppt | 1.1 |
| Example 29 | 6.0 ppt | 0.60 ppt | 0.50 ppt | 0.20 ppt | 0.26 ppt | 0.39 ppt | 1.95 ppt | 0.9 |
| Example 30 | 9.6 ppt | 0.96 ppt | 0.80 ppt | 0.32 ppt | 0.42 ppt | 0.62 ppt | 3.12 ppt | 1.4 |
| Example 31 | 10.8 ppt | 1.08 ppt | 0.90 ppt | 0.36 ppt | 0.47 ppt | 0.70 ppt | 3.51 ppt | 1.6 |
| Example 32 | 4.8 ppt | 0.48 ppt | 0.40 ppt | 0.16 ppt | 0.21 ppt | 0.31 ppt | 1.56 ppt | 0.7 |
| Example 33 | 10 ppt | 1.00 ppt | 0.83 ppt | 0.33 ppt | 0.43 ppt | 0.65 ppt | 3.24 ppt | 1.5 |
| Example 34 | 10 ppt | 1.00 ppt | 0.83 ppt | 0.33 ppt | 0.43 ppt | 0.65 ppt | 3.24 ppt | 1.7 |

TABLE 1-continued

| | | | | | | | | |
|---|---|---|---|---|---|---|---|---|
| Example 35 | 10 ppt | 1.00 ppt | 0.83 ppt | 0.33 ppt | 0.43 ppt | 0.65 ppt | 3.24 ppt | 1.7 |
| Example 36 | 9.0 ppt | 0.90 ppt | 0.75 ppt | 0.30 ppt | 0.39 ppt | 0.59 ppt | 2.93 ppt | 1.5 |
| Example 37 | 5.0 ppt | 0.50 ppt | 0.42 ppt | 0.17 ppt | 0.22 ppt | 0.33 ppt | 1.64 ppt | 0.83 |
| Example 38 | 3.0 ppt | 0.30 ppt | 0.25 ppt | 0.10 ppt | 0.13 ppt | 0.20 ppt | 0.98 ppt | 0.50 |
| Example 39 | 4.0 ppt | 0.40 ppt | 0.33 ppt | 0.13 opt | 0.17 ppt | 0.26 ppt | 1.29 ppt | 0.67 |
| Example 40 | 6.0 ppt | 0.60 ppt | 0.50 ppt | 0.20 ppt | 0.26 ppt | 0.39 ppt | 1.95 ppt | 1.0 |
| Example 41 | 5.0 ppt | 0.50 ppt | 0.42 ppt | 0.17 ppt | 0.22 ppt | 0.33 ppt | 1.64 ppt | 0.83 |
| Example 42 | 4.0 ppt | 0.40 ppt | 0.33 ppt | 0.13 ppt | 0.17 ppt | 0.26 ppt | 1.29 ppt | 0.67 |

| | Test result relating to washed second filter Content of metal particles in test liquid (with respect to total mass of test liquid) | | | | | | |
|---|---|---|---|---|---|---|---|
| | Total content (based on mass) | Content of particles containing specific metal (based on mass) | | | | | |
| | | Fe | Al | Cr | Ni | Ti | Total |
| Example 1 | | | | | | | |
| Example 2 | | | | | | | |
| Example 3 | 3.8 ppt | 0.40 ppt | 0.33 ppt | 0.13 ppt | 0.17 ppt | 0.26 ppt | 1.29 ppt |
| Example 4 | 3.3 ppt | 0.35 ppt | 0.29 ppt | 0.12 ppt | 0.15 ppt | 0.23 ppt | 1.14 ppt |
| Example 5 | 2.9 ppt | 0.30 ppt | 0.25 ppt | 0.10 ppt | 0.13 ppt | 0.20 ppt | 0.98 ppt |
| Example 6 | 3.3 ppt | 0.35 ppt | 0.29 ppt | 0.12 ppt | 0.15 ppt | 0.23 ppt | 1.14 ppt |
| Example 7 | 4.3 ppt | 0.45 ppt | 0.38 ppt | 0.15 ppt | 0.20 ppt | 0.29 ppt | 1.47 ppt |
| Example 8 | 3.8 ppt | 0.40 ppt | 0.33 ppt | 0.13 ppt | 0.17 ppt | 0.26 ppt | 1.29 ppt |
| Example 9 | 3.3 ppt | 0.35 ppt | 0.29 ppt | 0.12 ppt | 0.15 ppt | 0.23 ppt | 1.14 ppt |
| Example 10 | 2.9 ppt | 0.30 ppt | 0.25 ppt | 0.10 ppt | 0.13 ppt | 0.20 ppt | 0.98 ppt |
| Example 11 | 2.4 ppt | 0.25 ppt | 0.21 ppt | 0.08 ppt | 0.11 ppt | 0.16 ppt | 0.81 ppt |
| Example 12 | 3.8 ppt | 0.40 ppt | 0.33 ppt | 0.13 ppt | 0.17 ppt | 0.26 ppt | 1.29 ppt |
| Example 13 | 4.3 ppt | 0.45 ppt | 0.38 ppt | 0.15 ppt | 0.20 ppt | 0.29 ppt | 1.47 ppt |
| Example 14 | 1.9 ppt | 0.20 ppt | 0.17 ppt | 0.07 ppt | 0.09 ppt | 0.13 ppt | 0.66 ppt |
| Example 15 | 2.9 ppt | 0.30 ppt | 0.25 ppt | 0.10 ppt | 0.13 ppt | 0.20 ppt | 0.98 ppt |
| Example 16 | 3.3 ppt | 0.35 ppt | 0.29 ppt | 0.12 ppt | 0.15 ppt | 0.23 ppt | 1.14 ppt |
| Example 17 | 3.3 ppt | 0.35 ppt | 0.29 ppt | 0.12 ppt | 0.15 ppt | 0.23 ppt | 1.14 ppt |
| Example 18 | 2.9 ppt | 0.30 ppt | 0.25 ppt | 0.10 ppt | 0.13 ppt | 0.20 ppt | 0.98 ppt |
| Example 19 | 4.3 ppt | 0.45 ppt | 0.38 ppt | 0.15 ppt | 0.20 ppt | 0.29 ppt | 1.47 ppt |
| Example 20 | 7.1 ppt | 0.75 ppt | 0.63 ppt | 0.25 ppt | 0.33 ppt | 0.49 ppt | 2.45 ppt |
| Example 21 | 5.7 ppt | 0.60 ppt | 0.50 ppt | 0.20 ppt | 0.26 ppt | 0.39 ppt | 1.95 ppt |
| Example 22 | 5.0 ppt | 0.53 ppt | 0.44 ppt | 0.18 ppt | 0.23 ppt | 0.34 ppt | 1.72 ppt |
| Example 23 | 4.3 ppt | 0.45 ppt | 0.38 ppt | 0.15 ppt | 0.20 ppt | 0.29 ppt | 1.47 ppt |
| Example 24 | 5.0 ppt | 0.53 ppt | 0.44 ppt | 0.18 ppt | 0.23 ppt | 0.34 ppt | 1.72 ppt |
| Example 25 | 6.4 ppt | 0.68 ppt | 0.56 ppt | 0.23 ppt | 0.29 ppt | 0.44 ppt | 2.20 ppt |
| Example 26 | 5.7 ppt | 0.60 ppt | 0.50 ppt | 0.20 ppt | 0.26 ppt | 0.39 ppt | 1.95 ppt |
| Example 27 | 5.0 ppt | 0.53 ppt | 0.44 ppt | 0.18 ppt | 0.23 ppt | 0.34 ppt | 1.72 ppt |
| Example 28 | 4.3 ppt | 0.45 ppt | 0.38 ppt | 0.15 ppt | 0.20 ppt | 0.29 ppt | 1.47 ppt |
| Example 29 | 3.6 ppt | 0.38 ppt | 0.31 ppt | 0.13 ppt | 0.16 ppt | 0.24 ppt | 1.22 ppt |
| Example 30 | 5.7 ppt | 0.60 ppt | 0.50 ppt | 0.20 ppt | 0.26 ppt | 0.39 ppt | 1.95 ppt |
| Example 31 | 6.4 ppt | 0.68 ppt | 0.56 ppt | 0.23 ppt | 0.29 ppt | 0.44 ppt | 2.20 ppt |
| Example 32 | 2.9 ppt | 0.30 ppt | 0.25 ppt | 0.10 ppt | 0.13 ppt | 0.20 ppt | 0.98 ppt |
| Example 33 | 4.3 ppt | 0.45 ppt | 0.38 ppt | 0.15 ppt | 0.20 ppt | 0.29 ppt | 1.47 ppt |
| Example 34 | 4.8 ppt | 0.50 ppt | 0.42 ppt | 0.17 ppt | 0.22 ppt | 0.33 ppt | 1.64 ppt |
| Example 35 | 4.8 ppt | 0.50 ppt | 0.42 ppt | 0.17 ppt | 0.22 ppt | 0.33 ppt | 1.64 ppt |
| Example 36 | 4.3 ppt | 0.45 ppt | 0.38 ppt | 0.15 ppt | 0.20 ppt | 0.29 ppt | 1.47 ppt |
| Example 37 | 2.4 ppt | 0.25 ppt | 0.21 ppt | 0.08 ppt | 0.11 ppt | 0.16 ppt | 0.81 ppt |
| Example 38 | 1.4 ppt | 0.15 ppt | 0.13 ppt | 0.05 ppt | 0.07 ppt | 0.10 ppt | 0.50 ppt |
| Example 39 | 1.9 ppt | 0.20 ppt | 0.17 ppt | 0.07 ppt | 0.09 ppt | 0.13 ppt | 0.66 ppt |
| Example 40 | 2.9 ppt | 0.30 ppt | 0.25 ppt | 0.10 ppt | 0.13 ppt | 0.20 ppt | 0.98 ppt |
| Example 41 | 2.4 ppt | 0.25 ppt | 0.21 ppt | 0.08 ppt | 0.11 ppt | 0.16 ppt | 0.81 ppt |
| Example 42 | 1.9 ppt | 0.20 ppt | 0.17 ppt | 0.07 ppt | 0.09 ppt | 0.13 ppt | 0.66 ppt |

| | Test result relating to washed second filter | | | | | | | |
|---|---|---|---|---|---|---|---|---|
| | Content of metal-containing ions in test liquid (with respect to total mass of test liquid) | | | | | | | Content of organic impurity in test liquid (mass ppm) |
| | Total content (based on mass) | Content of particles containing specific metal (based on mass) | | | | | | |
| | | Fe | Al | Cr | Ni | Ti | Total | |
| Example 1 | | | | | | | | |
| Example 2 | | | | | | | | |
| Example 3 | 7.8 ppt | 0.80 ppt | 0.67 ppt | 0.27 ppt | 0.35 ppt | 0.52 ppt | 2.61 ppt | 1.1 |
| Example 4 | 6.9 ppt | 0.70 ppt | 0.58 ppt | 0.23 ppt | 0.30 ppt | 0.46 ppt | 2.27 ppt | 0.93 |
| Example 5 | 5.9 ppt | 0.60 ppt | 0.50 ppt | 0.20 ppt | 0.26 ppt | 0.39 ppt | 1.95 ppt | 0.80 |
| Example 6 | 6.9 ppt | 0.70 ppt | 0.58 ppt | 0.23 ppt | 0.30 ppt | 0.46 ppt | 2.27 ppt | 0.93 |
| Example 7 | 8.8 ppt | 0.90 ppt | 0.75 ppt | 0.30 ppt | 0.39 ppt | 0.59 ppt | 2.93 ppt | 1.2 |
| Example 8 | 7.8 ppt | 0.80 ppt | 0.67 ppt | 0.27 ppt | 0.35 ppt | 0.52 ppt | 2.61 ppt | 1.1 |
| Example 9 | 6.9 ppt | 0.70 ppt | 0.58 ppt | 0.23 ppt | 0.30 ppt | 0.46 ppt | 2.27 ppt | 0.93 |

TABLE 1-continued

| | | | | | | | | |
|---|---|---|---|---|---|---|---|---|
| Example 10 | 5.9 ppt | 0.60 ppt | 0.50 ppt | 0.20 ppt | 0.26 ppt | 0.39 ppt | 1.95 ppt | 0.80 |
| Example 11 | 4.9 ppt | 0.50 ppt | 0.42 ppt | 0.17 ppt | 0.22 ppt | 0.33 ppt | 1.64 ppt | 0.67 |
| Example 12 | 7.8 ppt | 0.80 ppt | 0.67 ppt | 0.27 ppt | 0.35 ppt | 0.52 ppt | 2.61 ppt | 1.1 |
| Example 13 | 8.8 ppt | 0.90 ppt | 0.75 ppt | 0.30 ppt | 0.39 ppt | 0.59 ppt | 2.93 ppt | 1.2 |
| Example 14 | 3.9 ppt | 0.40 ppt | 0.33 ppt | 0.13 ppt | 0.17 ppt | 0.26 ppt | 1.29 ppt | 0.53 |
| Example 15 | 5.9 ppt | 0.60 ppt | 0.50 ppt | 0.20 ppt | 0.26 ppt | 0.39 ppt | 1.95 ppt | 0.80 |
| Example 16 | 6.9 ppt | 0.70 ppt | 0.58 ppt | 0.23 ppt | 0.30 ppt | 0.46 ppt | 2.27 ppt | 0.93 |
| Example 17 | 6.9 ppt | 0.70 ppt | 0.58 ppt | 0.23 ppt | 0.30 ppt | 0.46 ppt | 2.27 ppt | 0.93 |
| Example 18 | 5.9 ppt | 0.60 ppt | 0.50 ppt | 0.20 ppt | 0.26 ppt | 0.39 ppt | 1.95 ppt | 0.80 |
| Example 19 | 7.1 ppt | 0.72 ppt | 0.60 ppt | 0.24 ppt | 0.31 ppt | 0.47 ppt | 2.34 ppt | 0.8 |
| Example 20 | 11.8 ppt | 1.20 ppt | 1.00 ppt | 0.40 ppt | 0.52 ppt | 0.78 ppt | 3.90 ppt | 2.4 |
| Example 21 | 9.4 ppt | 0.96 ppt | 0.80 ppt | 0.32 ppt | 0.42 ppt | 0.62 ppt | 3.12 ppt | 1.1 |
| Example 22 | 8.2 ppt | 0.84 ppt | 0.70 ppt | 0.28 ppt | 0.37 ppt | 0.55 ppt | 2.74 ppt | 1.0 |
| Example 23 | 7.1 ppt | 0.72 ppt | 0.60 ppt | 0.24 ppt | 0.31 ppt | 0.47 ppt | 2.34 ppt | 0.8 |
| Example 24 | 8.2 ppt | 0.84 ppt | 0.70 ppt | 0.28 ppt | 0.37 ppt | 0.55 ppt | 2.74 ppt | 1.0 |
| Example 25 | 10.6 ppt | 1.08 ppt | 0.90 ppt | 0.36 ppt | 0.47 ppt | 0.70 ppt | 3.51 ppt | 1.3 |
| Example 26 | 9.4 ppt | 0.96 ppt | 0.80 ppt | 0.32 ppt | 0.42 ppt | 0.62 ppt | 3.12 ppt | 1.1 |
| Example 27 | 8.2 ppt | 0.84 ppt | 0.70 ppt | 0.28 ppt | 0.37 ppt | 0.55 ppt | 2.74 ppt | 1.0 |
| Example 28 | 7.1 ppt | 0.72 ppt | 0.60 ppt | 0.24 ppt | 0.31 ppt | 0.47 ppt | 2.34 ppt | 0.8 |
| Example 29 | 5.9 ppt | 0.60 ppt | 0.50 ppt | 0.20 ppt | 0.26 ppt | 0.39 ppt | 1.95 ppt | 0.7 |
| Example 30 | 9.4 ppt | 0.96 ppt | 0.80 ppt | 0.32 ppt | 0.42 ppt | 0.62 ppt | 3.12 ppt | 1.1 |
| Example 31 | 10.6 ppt | 1.08 ppt | 0.90 ppt | 0.36 ppt | 0.47 ppt | 0.70 ppt | 3.51 ppt | 1.3 |
| Example 32 | 4.7 ppt | 0.48 ppt | 0.40 ppt | 0.16 ppt | 0.21 ppt | 0.31 ppt | 1.56 ppt | 0.6 |
| Example 33 | 9.8 ppt | 1.00 ppt | 0.83 ppt | 0.33 ppt | 0.43 ppt | 0.65 ppt | 3.24 ppt | 1.2 |
| Example 34 | 9.8 ppt | 1.00 ppt | 0.83 ppt | 0.33 ppt | 0.43 ppt | 0.65 ppt | 3.24 ppt | 1.3 |
| Example 35 | 9.8 ppt | 1.00 ppt | 0.83 ppt | 0.33 ppt | 0.43 ppt | 0.65 ppt | 3.24 ppt | 1.3 |
| Example 36 | 8.8 ppt | 0.90 ppt | 0.75 ppt | 0.30 ppt | 0.39 ppt | 0.59 ppt | 2.93 ppt | 1.2 |
| Example 37 | 4.9 ppt | 0.50 ppt | 0.42 ppt | 0.17 ppt | 0.22 ppt | 0.33 ppt | 1.64 ppt | 0.67 |
| Example 38 | 2.9 ppt | 0.30 ppt | 0.25 ppt | 0.10 ppt | 0.13 ppt | 0.20 ppt | 0.98 ppt | 0.40 |
| Example 39 | 3.9 ppt | 0.40 ppt | 0.33 ppt | 0.13 ppt | 0.17 ppt | 0.26 ppt | 1.29 ppt | 0.53 |
| Example 40 | 5.9 ppt | 0.60 ppt | 0.50 ppt | 0.20 ppt | 0.26 ppt | 0.39 ppt | 1.95 ppt | 0.80 |
| Example 41 | 4.9 ppt | 0.50 ppt | 0.42 ppt | 0.17 ppt | 0.22 ppt | 0.33 ppt | 1.64 ppt | 0.67 |
| Example 42 | 3.9 ppt | 0.40 ppt | 0.33 ppt | 0.13 ppt | 0.17 ppt | 0.26 ppt | 1.29 ppt | 0.53 |

| | Test result relating to washed third filter Content of metal particles in test liquid (with respect to total mass of test liquid) | | | | | |
|---|---|---|---|---|---|---|
| | Total content (based on mass) | Content of particles containing specific metal (based on mass) | | | | |
| | | Fe | Al | Cr | Ni | Ti | Total |
| Example 1 | | | | | | | |
| Example 2 | | | | | | | |
| Example 3 | | | | | | | |
| Example 4 | | | | | | | |
| Example 5 | | | | | | | |
| Example 6 | | | | | | | |
| Example 7 | | | | | | | |
| Example 8 | | | | | | | |
| Example 9 | | | | | | | |
| Example 10 | | | | | | | |
| Example 11 | | | | | | | |
| Example 12 | | | | | | | |
| Example 13 | | | | | | | |
| Example 14 | | | | | | | |
| Example 15 | | | | | | | |
| Example 16 | | | | | | | |
| Example 17 | | | | | | | |
| Example 18 | | | | | | | |
| Example 19 | | | | | | | |
| Example 20 | | | | | | | |
| Example 21 | | | | | | | |
| Example 22 | | | | | | | |
| Example 23 | | | | | | | |
| Example 24 | | | | | | | |
| Example 25 | | | | | | | |
| Example 26 | | | | | | | |
| Example 27 | | | | | | | |
| Example 28 | | | | | | | |
| Example 29 | | | | | | | |
| Example 30 | | | | | | | |
| Example 31 | | | | | | | |
| Example 32 | | | | | | | |
| Example 33 | | | | | | | |
| Example 34 | | | | | | | |
| Example 35 | | | | | | | |
| Example 36 | | | | | | | |
| Example 37 | | | | | | | |

TABLE 1-continued

Example 38
Example 39
Example 40
Example 41
Example 42

| | Test result relating to washed third filter | | | | | | | |
|---|---|---|---|---|---|---|---|---|
| | Content of metal-containing ions in test liquid (with respect to total mass of test liquid) | | | | | | | Content of organic impurity |
| | Total content (based on | Content of metal-containing ions (based on mass) | | | | | | in test liquid(mass |
| | mass) | Fe | Al | Cr | Ni | Ti | Total | ppm) |
| Example 1 | | | | | | | | |
| Example 2 | | | | | | | | |
| Example 3 | | | | | | | | |
| Example 4 | | | | | | | | |
| Example 5 | | | | | | | | |
| Example 6 | | | | | | | | |
| Example 7 | | | | | | | | |
| Example 8 | | | | | | | | |
| Example 9 | | | | | | | | |
| Example 10 | | | | | | | | |
| Example 11 | | | | | | | | |
| Example 12 | | | | | | | | |
| Example 13 | | | | | | | | |
| Example 14 | | | | | | | | |
| Example 15 | | | | | | | | |
| Example 16 | | | | | | | | |
| Example 17 | | | | | | | | |
| Example 18 | | | | | | | | |
| Example 19 | | | | | | | | |
| Example 20 | | | | | | | | |
| Example 21 | | | | | | | | |
| Example 22 | | | | | | | | |
| Example 23 | | | | | | | | |
| Example 24 | | | | | | | | |
| Example 25 | | | | | | | | |
| Example 26 | | | | | | | | |
| Example 27 | | | | | | | | |
| Example 28 | | | | | | | | |
| Example 29 | | | | | | | | |
| Example 30 | | | | | | | | |
| Example 31 | | | | | | | | |
| Example 32 | | | | | | | | |
| Example 33 | | | | | | | | |
| Example 34 | | | | | | | | |
| Example 35 | | | | | | | | |
| Example 36 | | | | | | | | |
| Example 37 | | | | | | | | |
| Example 38 | | | | | | | | |
| Example 39 | | | | | | | | |
| Example 40 | | | | | | | | |
| Example 41 | | | | | | | | |
| Example 42 | | | | | | | | |

| | Purification condition for chemical liquid | | | | | | Filtration differential pressure | |
|---|---|---|---|---|---|---|---|---|
| | First stage | | Second stage | | Third stage | | | |
| | First filter | | Second filter | | Third filter | | First stage- | Second stage- |
| | Affinity with water | Material (average pore size) | Affinity with water | Material (average pore size) | Affinity with water | Material (average pore size) | Second stage (kPa) | Third stage(kPa) |
| Example 1 | Hydrophilic | Nylon (5 nm) | | | | | | |
| Example 2 | Hydrophobic | PE (5 nm) | | | | | | |
| Example 3 | Hydrophobic | PTFE (10 nm) | Hydrophilic | Nylon (5 nm) | | | 150 | |
| Example 4 | Hydrophobic | PTFE (10 nm) | Hydrophilic | Nylon (5 nm) | | | 150 | |
| Example 5 | Hydrophobic | PTFE (10 nm) | Hydrophilic | Nylon (5 nm) | | | 150 | |
| Example 6 | Hydrophobic | PTFE (10 nm) | Hydrophilic | Nylon (5 nm) | | | 150 | |
| Example 7 | Hydrophobic | PTFE (10 nm) | Hydrophilic | Nylon (5 nm) | | | 150 | |
| Example 8 | Hydrophobic | PTFE (10 nm) | Hydrophilic | Nylon (5 nm) | | | 150 | |
| Example 9 | Hydrophobic | PTFE (10 nm) | Hydrophilic | Nylon (5 nm) | | | 150 | |
| Example 10 | Hydrophobic | PTFE (10 nm) | Hydrophilic | Nylon (5 nm) | | | 150 | |

TABLE 1-continued

| | | | | | |
|---|---|---|---|---|---|
| Example 11 | Hydrophobic | PTFE (10 nm) | Hydrophilic | Nylon (5 nm) | 150 |
| Example 12 | Hydrophobic | PTFE (10 nm) | Hydrophilic | Nylon (5 nm) | 150 |
| Example 13 | Hydrophobic | PTFE (10 nm) | Hydrophilic | Nylon (5 nm) | 150 |
| Example 14 | Hydrophobic | PTFE (10 nm) | Hydrophilic | Nylon (5 nm) | 150 |
| Example 15 | Hydrophobic | PTFE (10 nm) | Hydrophilic | Nylon (5 nm) | 150 |
| Example 16 | Hydrophobic | PTFE (10 nm) | Hydrophilic | Nylon (5 nm) | 150 |
| Example 17 | Hydrophobic | PTFE (10 nm) | Hydrophilic | Nylon (5 nm) | 240 |
| Example 18 | Hydrophobic | PTFE (10 nm) | Hydrophilic | Nylon (5 nm) | 350 |
| Example 19 | Hydrophobic | PTFE (10 nm) | Hydrophilic | Nylon (5 nm) | 150 |
| Example 20 | Hydrophobic | PTFE (10 nm) | Hydrophilic | Nylon (5 nm) | 150 |
| Example 21 | Hydrophobic | PTFE (10 nm) | Hydrophilic | Nylon (5 nm) | 150 |
| Example 22 | Hydrophobic | PTFE (10 nm) | Hydrophilic | Nylon (5 nm) | 150 |
| Example 23 | Hydrophobic | PTFE (10 nm) | Hydrophilic | Nylon (5 nm) | 150 |
| Example 24 | Hydrophobic | PTFE (10 nm) | Hydrophilic | Nylon (5 nm) | 150 |
| Example 25 | Hydrophobic | PTFE (10 nm) | Hydrophilic | Nylon (5 nm) | 150 |
| Example 26 | Hydrophobic | PTFE (10 nm) | Hydrophilic | Nylon (5 nm) | 150 |
| Example 27 | Hydrophobic | PTFE (10 nm) | Hydrophilic | Nylon (5 nm) | 150 |
| Example 28 | Hydrophobic | PTFE (10 nm) | Hydrophilic | Nylon (5 nm) | 150 |
| Example 29 | Hydrophobic | PTFE (10 nm) | Hydrophilic | Nylon (5 nm) | 150 |
| Example 30 | Hydrophobic | PTFE (10 nm) | Hydrophilic | Nylon (5 nm) | 150 |
| Example 31 | Hydrophobic | PTFE (10 nm) | Hydrophilic | Nylon (5 nm) | 150 |
| Example 32 | Hydrophobic | PTFE (10 nm) | Hydrophilic | Nylon (5 nm) | 150 |
| Example 33 | Hydrophobic | PTFE (10 nm) | Hydrophilic | Nylon (5 nm) | 150 |
| Example 34 | Hydrophobic | PTFE (10 nm) | Hydrophilic | Nylon (5 nm) | 150 |
| Example 35 | Hydrophobic | PTFE (20 nm) | Hydrophobic | PE (5 nm) | 140 |
| Example 36 | Hydrophobic | PTFE (20 nm) | Hydrophilic | Nylon (5 nm) | 140 |
| Example 37 | Hydrophobic | PTFE (10 nm) | Hydrophobic | UPE (3 nm) | 130 |
| Example 38 | Hydrophilic | IEX-PTFE (10 nm) surfric acid | Hydrophilic | Nylon (5 nm) | 160 |
| Example 39 | Hydrophobic | HDPE (10 nm) | Hydrophilic | Nylon (5 nm) | 140 |
| Example 40 | Hydrophobic | PTFE (10 nm) | Hydrophobic | HDPE (3 nm) | 150 |
| Example 41 | Hydrophobic | PP (20 nm) | Hydrophilic | Nylon (5 nm) | 140 |
| Example 42 | Hydrophilic | IEX-PTFE (10 nm) Imido | Hydrophilic | Nylon (5 nm) | 130 |

| | Chemical liquid | | | | | | | |
|---|---|---|---|---|---|---|---|---|
| | Organic solvent in purified chemical liquid | | Content of metal particles in purified chemical liquid (with respect to total mass of chemical liquid) | | | | | |
| | | | | Content of particles containing specific metal (mass ppt) | | | | |
| | Type | Content (based on mass) | Total content (mass ppt) | Fe | Al | Cr | Ni | Ti | Total |
| Example 1 | CyHe | Balance | 6.0 | 0.60 | 0.50 | 0.20 | 0.26 | 0.41 | 1.97 |
| Example 2 | CyHe | Balance | 18 | 1.80 | 1.50 | 0.60 | 0.78 | 1.23 | 5.91 |
| Example 3 | CyHe | Balance | 2.0 | 0.20 | 0.17 | 0.07 | 0.09 | 0.14 | 0.67 |
| Example 4 | CyHe | Balance | 1.8 | 0.18 | 0.15 | 0.06 | 0.08 | 0.12 | 0.59 |
| Example 5 | CyHe | Balance | 1.5 | 0.15 | 0.13 | 0.05 | 0.07 | 0.10 | 0.50 |
| Example 6 | CyHe | Balance | 1.8 | 0.18 | 0.15 | 0.06 | 0.08 | 0.12 | 0.59 |
| Example 7 | CyHe | Balance | 2.3 | 0.23 | 0.19 | 0.08 | 0.10 | 0.16 | 0.76 |
| Example 8 | CyHe | Balance | 2.0 | 0.20 | 0.17 | 0.07 | 0.09 | 0.14 | 0.67 |
| Example 9 | CyHe | Balance | 1.8 | 0.18 | 0.15 | 0.06 | 0.08 | 0.12 | 0.59 |
| Example 10 | CyHe | Balance | 1.5 | 0.15 | 0.13 | 0.05 | 0.07 | 0.10 | 0.50 |
| Example 11 | CyHe | Balance | 1.3 | 0.13 | 0.10 | 0.04 | 0.05 | 0.09 | 0.41 |
| Example 12 | CyHe | Balance | 2.0 | 0.20 | 0.17 | 0.07 | 0.09 | 0.14 | 0.67 |
| Example 13 | CyHe | Balance | 2.3 | 0.23 | 0.19 | 0.08 | 0.10 | 0.16 | 0.76 |
| Example 14 | CyHe | Balance | 1.0 | 0.10 | 0.08 | 0.03 | 0.04 | 0.07 | 0.32 |
| Example 15 | CyHe | Balance | 1.5 | 0.15 | 0.13 | 0.05 | 0.07 | 0.10 | 0.50 |
| Example 16 | CyHe | Balance | 1.8 | 0.18 | 0.15 | 0.06 | 0.08 | 0.12 | 0.59 |
| Example 17 | CyHe | Balance | 3.0 | 0.30 | 0.25 | 0.10 | 0.13 | 0.20 | 0.98 |
| Example 18 | CyHe | Balance | 8.0 | 0.80 | 0.67 | 0.27 | 0.35 | 0.55 | 2.64 |
| Example 19 | PGME | Balance | 3.0 | 0.30 | 0.25 | 0.10 | 0.13 | 0.20 | 0.98 |
| Example 20 | PGEE | Balance | 4.2 | 0.42 | 0.35 | 0.14 | 0.18 | 0.28 | 1.37 |
| Example 21 | PGPE | Balance | 3.8 | 0.38 | 0.31 | 0.13 | 0.16 | 0.26 | 1.24 |
| Example 22 | PGMEA | Balance | 2.1 | 0.21 | 0.18 | 0.07 | 0.09 | 0.14 | 0.69 |
| Example 23 | EL | Balance | 2.0 | 0.20 | 0.17 | 0.07 | 0.09 | 0.14 | 0.67 |
| Example 24 | MPM | Balance | 4.0 | 0.40 | 0.34 | 0.13 | 0.18 | 0.27 | 1.32 |
| Example 25 | CyPn | Balance | 3.6 | 0.36 | 0.30 | 0.12 | 0.15 | 0.24 | 1.17 |
| Example 26 | GBL | Balance | 3.3 | 0.33 | 0.28 | 0.11 | 0.14 | 0.23 | 1.09 |
| Example 27 | DIAE | Balance | 3.1 | 0.31 | 0.26 | 0.10 | 0.13 | 0.21 | 1.01 |
| Example 28 | nBA | Balance | 3.0 | 0.30 | 0.25 | 0.10 | 0.13 | 0.20 | 0.98 |
| Example 29 | iAA | Balance | 2.9 | 0.29 | 0.24 | 0.10 | 0.13 | 0.20 | 0.96 |
| Example 30 | IPA | Balance | 5.0 | 0.50 | 0.42 | 0.17 | 0.22 | 0.34 | 1.65 |
| Example 31 | PGMEA/ | Balance | 2.0 | 0.20 | 0.17 | 0.07 | 0.09 | 0.14 | 0.67 |

TABLE 1-continued

|  | PGME (7/3) | | | | | | | | |
|---|---|---|---|---|---|---|---|---|---|
| Example 32 | MIBC | Balance | 1.4 | 0.14 | 0.12 | 0.05 | 0.06 | 0.10 | 0.47 |
| Example 33 | CyHe | Balance | 10 | 1.00 | 0.83 | 0.33 | 0.43 | 0.68 | 3.27 |
| Example 34 | CyHe | Balance | 14 | 1.40 | 1.17 | 0.47 | 0.61 | 0.95 | 4.60 |
| Example 35 | CyHe | Balance | 16 | 1.60 | 1.33 | 0.53 | 0.70 | 1.09 | 5.25 |
| Example 36 | CyHe | Balance | 2.3 | 0.23 | 0.19 | 0.08 | 0.10 | 0.16 | 0.76 |
| Example 37 | CyHe | Balance | 1.3 | 0.13 | 0.10 | 0.04 | 0.05 | 0.09 | 0.41 |
| Example 38 | CyHe | Balance | 0.75 | 0.08 | 0.06 | 0.03 | 0.03 | 0.05 | 0.25 |
| Example 39 | CyHe | Balance | 1.0 | 0.10 | 0.08 | 0.03 | 0.04 | 0.07 | 0.32 |
| Example 40 | CyHe | Balance | 1.5 | 0.15 | 0.13 | 0.05 | 0.07 | 0.10 | 0.50 |
| Example 41 | CyHe | Balance | 1.3 | 0.13 | 0.10 | 0.04 | 0.05 | 0.09 | 0.41 |
| Example 42 | CyHe | Balance | 1.0 | 0.10 | 0.08 | 0.03 | 0.04 | 0.07 | 0.32 |

| | Chemical liquid | | | | | | | | |
|---|---|---|---|---|---|---|---|---|---|
| | Content of metal ions in purified chemical liquid (with respect to total mass of chemical liquid) | | | | | | | Content of organic impurity in purified chemical liquid (mass ppm) | Evaluation Short occurrence inhibition performance |
| | Total content (mass ppt) | Content of particles containing specific metal (mass ppt) | | | | | | | |
| | | Fe | Al | Cr | Ni | Ti | Total | | |
| Example 1 | 8 | 0.80 | 0.67 | 0.27 | 0.35 | 0.55 | 2.64 | 1.0 | B |
| Example 2 | 25 | 2.50 | 2.08 | 0.83 | 1.09 | 1.70 | 8.20 | 3.2 | C |
| Example 3 | 4 | 0.40 | 0.33 | 0.13 | 0.17 | 0.27 | 1.30 | 0.7 | A |
| Example 4 | 4 | 0.35 | 0.29 | 0.12 | 0.15 | 0.24 | 1.15 | 0.6 | A |
| Example 5 | 3 | 0.30 | 0.25 | 0.10 | 0.13 | 0.20 | 0.98 | 0.5 | A |
| Example 6 | 4 | 0.35 | 0.29 | 0.12 | 0.15 | 0.24 | 1.15 | 0.6 | A |
| Example 7 | 5 | 0.45 | 0.38 | 0.15 | 0.20 | 0.31 | 1.49 | 0.8 | A |
| Example 8 | 4 | 0.40 | 0.33 | 0.13 | 0.17 | 0.27 | 1.30 | 0.7 | A |
| Example 9 | 4 | 0.35 | 0.29 | 0.12 | 0.15 | 0.24 | 1.15 | 0.6 | A |
| Example 10 | 3 | 0.30 | 0.25 | 0.10 | 0.13 | 0.20 | 0.98 | 0.5 | A |
| Example 11 | 3 | 0.25 | 0.21 | 0.08 | 0.11 | 0.17 | 0.82 | 0.4 | A |
| Example 12 | 4 | 0.40 | 0.33 | 0.13 | 0.17 | 0.27 | 1.30 | 0.7 | A |
| Example 13 | 5 | 0.45 | 0.38 | 0.15 | 0.20 | 0.31 | 1.49 | 0.8 | A |
| Example 14 | 2 | 0.20 | 0.17 | 0.07 | 0.09 | 0.14 | 0.67 | 0.3 | A |
| Example 15 | 3 | 0.30 | 0.25 | 0.10 | 0.13 | 0.20 | 0.98 | 0.5 | A |
| Example 16 | 4 | 0.35 | 0.29 | 0.12 | 0.15 | 0.24 | 1.15 | 1 | A |
| Example 17 | 7 | 0.70 | 0.58 | 0.23 | 0.30 | 0.48 | 2.29 | 1.0 | B |
| Example 18 | 12 | 1.20 | 1.00 | 0.40 | 0.52 | 0.82 | 3.94 | 1.9 | C |
| Example 19 | 5 | 0.48 | 0.40 | 0.16 | 0.21 | 0.33 | 1.58 | 0.7 | A |
| Example 20 | 7 | 0.67 | 0.56 | 0.22 | 0.29 | 0.45 | 2.19 | 1.6 | A |
| Example 21 | 6 | 0.60 | 0.50 | 0.20 | 0.26 | 0.41 | 1.97 | 0.9 | A |
| Example 22 | 3 | 0.34 | 0.28 | 0.11 | 0.15 | 0.23 | 1.11 | 0.5 | A |
| Example 23 | 3 | 0.33 | 0.27 | 0.11 | 0.14 | 0.22 | 1.07 | 0.5 | A |
| Example 24 | 6 | 0.65 | 0.54 | 0.22 | 0.28 | 0.44 | 2.13 | 0.9 | A |
| Example 25 | 6 | 0.57 | 0.47 | 0.19 | 0.25 | 0.39 | 1.87 | 0.8 | A |
| Example 26 | 5 | 0.53 | 0.44 | 0.18 | 0.23 | 0.36 | 1.74 | 0.8 | A |
| Example 27 | 5 | 0.49 | 0.41 | 0.16 | 0.21 | 0.34 | 1.61 | 0.7 | A |
| Example 28 | 5 | 0.48 | 0.40 | 0.16 | 0.21 | 0.33 | 1.58 | 0.7 | A |
| Example 29 | 5 | 0.46 | 0.38 | 0.15 | 0.20 | 0.31 | 1.50 | 0.7 | A |
| Example 30 | 8 | 0.80 | 0.67 | 0.27 | 0.35 | 0.55 | 2.64 | 1.2 | A |
| Example 31 | 6 | 0.60 | 0.50 | 0.20 | 0.26 | 0.41 | 1.97 | 1.3 | A |
| Example 32 | 2 | 0.23 | 0.19 | 0.08 | 0.10 | 0.16 | 0.76 | 0.3 | A |
| Example 33 | 15 | 1.50 | 1.25 | 0.50 | 0.65 | 1.02 | 4.92 | 2.0 | C |
| Example 34 | 18 | 1.80 | 1.50 | 0.60 | 0.78 | 1.23 | 5.91 | 2.6 | C |
| Example 35 | 18 | 1.80 | 1.50 | 0.60 | 0.78 | 1.23 | 5.91 | 3.1 | B |
| Example 36 | 10 | 1.00 | 0.83 | 0.33 | 0.43 | 0.68 | 3.27 | 0.8 | A |
| Example 37 | 6 | 0.60 | 0.50 | 0.20 | 0.26 | 0.41 | 1.97 | 0.4 | B |
| Example 38 | 2 | 0.20 | 0.17 | 0.07 | 0.09 | 0.14 | 0.67 | 0.3 | A |
| Example 39 | 2 | 0.20 | 0.17 | 0.07 | 0.09 | 0.14 | 0.67 | 0.3 | A |
| Example 40 | 5 | 0.50 | 0.42 | 0.17 | 0.22 | 0.34 | 1.65 | 0.5 | B |
| Example 41 | 8 | 0.80 | 0.67 | 0.27 | 0.35 | 0.55 | 2.64 | 0.4 | A |
| Example 42 | 2 | 0.20 | 0.17 | 0.07 | 0.09 | 0.14 | 0.67 | 0.3 | A |

| | Washing condition for filter | | | |
|---|---|---|---|---|
| | Washing solution | | Washing method | Test liquid |
| | Type | Solubility parameter (MPa)$^{0.5}$ | | |
| Example 43 | CyHe | 19.6 | Passing washing | CyHe |
| Example 44 | CyHe | 19.6 | solution through | CyHe |
| Example 45 | CyHe | 19.6 | filter, immersing | CyHe |
| Example 46 | CyHe | 19.6 | filter into washing | CyHe |

TABLE 1-continued

| | | | | | solution, and the | | CyHe |
|---|---|---|---|---|---|---|---|
| Example 47 | CyHe | 19.6 | | | like; the filter was | | CyHe |
| Example 48 | CyHe | 19.6 | | | washed by | | CyHe |
| Example 49 | CyHe | 19.6 | | | appropriately | | CyHe |
| Example 50 | CyHe | 19.6 | | | setting the | | CyHe |
| Comparative Example 1 | CyHe | 19.6 | | | washing method, the number of | | CyHe |
| Comparative Example 2 | CyHe | 19.6 | | | times the washing solution was circulated, and the like in each of the examples and the comparative examples. | | CyHe |

Test result relating to washed first filter
Content of metal particles in test liquid
(with respect to total mass of test liquid)

| | Total content (based on mass) | Content of particles containing specific metal (based on mass) | | | | | |
|---|---|---|---|---|---|---|---|
| | | Fe | Al | Cr | Ni | Ti | Total |
| Example 43 | 1.5 ppt | 0.15 ppt | 0.13 ppt | 0.05 ppt | 0.07 ppt | 0.10 ppt | 0.50 ppt |
| Example 44 | 0.10 ppm | 0.10 ppm | 0.08 ppm | 0.03 ppm | 0.04 ppm | 0.07 ppm | 0.32 ppm |
| Example 45 | 1.5 ppt | 0.15 ppt | 0.13 ppt | 0.05 ppt | 0.07 ppt | 0.10 ppt | 0.50 ppt |
| Example 46 | 1.5 ppt | 0.15 ppt | 0.13 ppt | 0.05 ppt | 0.07 ppt | 0.10 ppt | 0.50 ppt |
| Example 47 | 10 ppb | 1.00 ppb | 0.83 ppb | 0.33 ppb | 0.43 ppb | 0.65 ppb | 3.24 ppb |
| Example 48 | 32 ppb | 3.20 ppb | 2.67 ppb | 1.07 ppb | 1.39 ppb | 2.08 ppb | 10.41 ppb |
| Example 49 | 3.0 ppm | 0.30 ppm | 0.25 ppm | 0.10 ppm | 0.13 ppm | 0.20 ppm | 0.98 ppm |
| Example 50 | 5.0 ppm | 0.50 ppm | 0.42 ppm | 0.17 ppm | 0.22 ppm | 0.33 ppm | 1.64 ppm |
| Comparative Example 1 | 28 ppm | 9.00 ppm | 3.60 ppm | 1.80 ppm | 1.26 ppm | 3.92 ppm | 19.58 ppm |
| Comparative Example 2 | 30 ppm | 10.00 ppm | 4.00 ppm | 2.00 ppm | 1.40 ppm | 4.35 ppm | 21.75 ppm |

Test result relating to washed first filter

| | Content of metal-containing ions in test liquid (with respect to total mass of test liquid) | | | | | | | Content of organic impurity in test liquid (mass ppm) |
|---|---|---|---|---|---|---|---|---|
| | Total content (based on mass) | Content of particles containing specific metal (based on mass) | | | | | | |
| | | Fe | Al | Cr | Ni | Ti | Total | |
| Example 43 | 3.0 ppt | 0.30 ppt | 0.25 ppt | 0.10 ppt | 0.13 ppt | 0.20 ppt | 0.98 ppt | 0.50 |
| Example 44 | 0.8 ppm | 0.20 ppm | 0.17 ppm | 0.07 ppm | 0.09 ppm | 0.13 ppm | 0.66 ppm | 0.33 |
| Example 45 | 3.0 ppt | 0.30 ppt | 0.25 ppt | 0.10 ppt | 0.13 ppt | 0.20 ppt | 0.98 ppt | 0.50 |
| Example 46 | 3.0 ppt | 0.30 ppt | 0.25 ppt | 0.10 ppt | 0.13 ppt | 0.20 ppt | 0.98 ppt | 0.50 |
| Example 47 | 6.0 ppb | 0.60 ppb | 0.50 ppb | 0.20 ppb | 0.26 ppb | 0.39 ppb | 1.95 ppb | 12 |
| Example 48 | 12 ppb | 1.20 ppb | 1.00 ppb | 0.40 ppb | 0.52 ppb | 0.78 ppb | 3.90 ppb | 18 |
| Example 49 | 1.0 ppm | 0.10 ppm | 0.08 ppm | 0.03 ppm | 0.04 ppm | 0.07 ppm | 0.32 ppm | 12 |
| Example 50 | 2.0 ppm | 0.20 ppm | 0.17 ppm | 0.07 ppm | 0.09 ppm | 0.13 ppm | 0.66 ppm | 18 |
| Comparative Example 1 | 36 ppm | 3.60 ppm | 3.00 ppm | 1.20 ppm | 1.57 ppm | 2.34 ppm | 11.71 ppm | 12 |
| Comparative Example 2 | 45 ppm | 4.50 ppm | 3.75 ppm | 1.50 ppm | 1.96 ppm | 2.93 ppm | 14.64 ppm | 18 |

Test result relating to washed second filter
Content of metal particles in test liquid
(with respect to total mass of test liquid)

| | Total content (based on mass) | Content of particles containing specific metal (based on mass) | | | | | |
|---|---|---|---|---|---|---|---|
| | | Fe | Al | Cr | Ni | Ti | Total |
| Example 43 | 1.4 ppt | 0.15 ppt | 0.13 ppt | 0.05 ppt | 0.07 ppt | 0.10 ppt | 0.50 ppt |
| Example 44 | 0.95 ppm | 0.10 ppm | 0.08 ppm | 0.03 ppm | 0.04 ppm | 0.07 ppm | 0.32 ppm |
| Example 45 | 1.4 ppt | 0.15 ppt | 0.13 ppt | 0.05 ppt | 0.07 ppt | 0.10 ppt | 0.50 ppt |
| Example 46 | 1.4 ppt | 0.15 ppt | 0.13 ppt | 0.05 ppt | 0.07 ppt | 0.10 ppt | 0.50 ppt |
| Example 47 | 7.6 ppb | 0.76 ppb | 0.25 ppb | 0.15 ppb | 0.19 ppb | 0.34 ppb | 1.69 ppb |
| Example 48 | 9.5 ppb | 0.95 ppb | 0.32 ppb | 0.19 ppb | 0.24 ppb | 0.42 ppb | 2.12 ppb |

TABLE 1-continued

|  | Total content (based on mass) | Fe | Al | Cr | Ni | Ti | Total |
|---|---|---|---|---|---|---|---|
| Example 49 | 2.9 ppm | 0.29 ppm | 0.10 ppm | 0.06 ppm | 0.07 ppm | 0.13 ppm | 0.65 ppm |
| Example 50 | 5.0 ppm | 0.50 ppm | 0.17 ppm | 0.10 ppm | 0.13 ppm | 0.22 ppm | 1.12 ppm |
| Comparative Example 1 | 15 ppm | 4.50 ppm | 1.00 ppm | 1.30 ppm | 1.20 ppm | 2.00 ppm | 10.00 ppm |
| Comparative Example 2 | | | | | | | |

Test result relating to washed second filter

| | Content of metal-containing ions in test liquid (with respect to total mass of test liquid) | | | | | | | Content of organic impurity in test liquid (mass ppm) |
|---|---|---|---|---|---|---|---|---|
| | Total content (based on mass) | Content of particles containing specific metal (based on mass) | | | | | | |
| | | Fe | Al | Cr | Ni | Ti | Total | |
| Example 43 | 2.9 ppt | 0.30 ppt | 0.25 ppt | 0.10 ppt | 0.13 ppt | 0.20 ppt | 0.98 ppt | 0.40 |
| Example 44 | 2.0 ppm | 0.20 ppm | 0.17 ppm | 0.07 ppm | 0.09 ppm | 0.13 ppm | 0.66 ppm | 0.27 |
| Example 45 | 2.9 ppt | 0.30 ppt | 0.25 ppt | 0.10 ppt | 0.13 ppt | 0.20 ppt | 0.98 ppt | 0.40 |
| Example 46 | 2.9 ppt | 0.30 ppt | 0.25 ppt | 0.10 ppt | 0.13 ppt | 0.20 ppt | 0.98 ppt | 0.40 |
| Example 47 | 7.6 ppb | 0.76 ppb | 0.25 ppb | 0.15 ppb | 0.19 ppb | 0.34 ppb | 1.69 ppb | 0.80 |
| Example 48 | 10 ppb | 0.95 ppb | 0.32 ppb | 0.19 ppb | 0.24 ppb | 0.42 ppb | 2.12 ppb | 1.0 |
| Example 49 | 2.9 ppm | 0.29 ppm | 0.10 ppm | 0.06 ppm | 0.07 ppm | 0.13 ppm | 0.65 ppm | 2.0 |
| Example 50 | 5.0 ppm | 0.50 ppm | 0.17 ppm | 0.10 ppm | 0.13 ppm | 0.22 ppm | 1.12 ppm | 3.0 |
| Comparative Example 1 | 15 ppm | 1.50 ppm | 0.50 ppm | 0.30 ppm | 0.38 ppm | 0.67 ppm | 3.35 ppm | 15 |
| Comparative Example 2 | | | | | | | | |

Test result relating to washed third filter
Content of metal particles in test liquid
(with respect to total mass of test liquid)

| | Total content (based on mass) | Content of particles containing specific metal (based on mass) | | | | | |
|---|---|---|---|---|---|---|---|
| | | Fe | Al | Cr | Ni | Ti | Total |
| Example 43 | 1.4 ppt | 0.15 ppt | 0.13 ppt | 0.05 ppt | 0.07 ppt | 0.10 ppt | 0.50 ppt |
| Example 44 | 0.9 ppm | 0.10 ppm | 0.08 ppm | 0.03 ppm | 0.04 ppm | 0.07 ppm | 0.32 ppm |
| Example 45 | 1.4 ppt | 0.15 ppt | 0.13 ppt | 0.05 ppt | 0.07 ppt | 0.10 ppt | 0.50 ppt |
| Example 46 | 1.4 ppt | 0.15 ppt | 0.13 ppt | 0.05 ppt | 0.07 ppt | 0.10 ppt | 0.50 ppt |
| Example 47 | | | | | | | |
| Example 48 | | | | | | | |
| Example 49 | | | | | | | |
| Example 50 | | | | | | | |
| Comparative Example 1 | | | | | | | |
| Comparative Example 2 | | | | | | | |

Test result relating to washed third filter

| | Content of metal-containing ions in test liquid (with respect to total mass of test liquid) | | | | | | | Content of organic impurity in test liquid (mass ppm) |
|---|---|---|---|---|---|---|---|---|
| | Total content (based on mass) | Content of particles containing specific metal (based on mass) | | | | | | |
| | | Fe | Al | Cr | Ni | Ti | Total | |
| Example 43 | 2.9 ppt | 0.30 ppt | 0.25 ppt | 0.10 ppt | 0.13 ppt | 0.20 ppt | 0.98 ppt | 0.3 |
| Example 44 | 1.9 ppm | 0.20 ppm | 0.17 ppm | 0.07 ppm | 0.09 ppm | 0.13 ppm | 0.66 ppm | 0.2 |
| Example 45 | 2.9 ppt | 0.30 ppt | 0.25 ppt | 0.10 ppt | 0.13 ppt | 0.20 ppt | 0.98 ppt | 0.32 |
| Example 46 | 2.9 ppt | 0.30 ppt | 0.25 ppt | 0.10 ppt | 0.13 ppt | 0.20 ppt | 0.98 ppt | 0.32 |
| Example 47 | | | | | | | | |
| Example 48 | | | | | | | | |
| Example 49 | | | | | | | | |
| Example 50 | | | | | | | | |
| Comparative Example 1 | | | | | | | | |
| Comparative Example 2 | | | | | | | | |

TABLE 1-continued

| | Purification condition for chemical liquid | | | | | | | |
|---|---|---|---|---|---|---|---|---|
| | First stage First filter | | Second stage Second filter | | Third stage Third filter | | Filtration differential pressure | |
| | Affinity with water | Material (average pore size) | Affinity with water | Material (average pore size) | Affinity with water | Material (average pore size) | First stage- Second stage(kPa) | Second stage- Third stage(kPa) |
| Example 43 | Hydrophilic | IEX-PTFE (10 nm) surfric acid | Hydrophobic | PTFE (10 nm) | Hydrophobic | UPE (3 nm) | 120 | 110 |
| Example 44 | Hydrophilic | IEX-PTFE (10 nm) surfric acid | Hydrophobic | PTFE (10 nm) | Hydrophilic | Nylon (5 nm) | 120 | 110 |
| Example 45 | Hydrophilic | IEX-PTFE (10 nm) carboxylic acid | Hydrophobic | PTFE (10 nm) | Hydrophilic | Nylon (5 nm) | 120 | 110 |
| Example 46 | Hydrophilic | IEX-PTFE (10 nm) Imido | Hydrophobic | PTFE (10 nm) | Hydrophilic | Nylon (5 nm) | 130 | 120 |
| Example 47 | Hydrophobic | PTFE (10 nm) | Hydrophilic | Nylon (5 nm) | | | 150 | |
| Example 48 | Hydrophobic | PTFE (10 nm) | Hydrophilic | Nylon (5 nm) | | | 150 | |
| Example 49 | Hydrophobic | PTFE (10 nm) | Hydrophilic | Nylon (5 nm) | | | 150 | |
| Example 50 | Hydrophobic | PTFE (10 nm) | Hydrophilic | Nylon (5 nm) | | | 150 | |
| Comparative Example 1 | Hydrophobic | PTFE (10 nm) | Hydrophilic | Nylon (5 nm) | | | 150 | |
| Comparative Example 2 | Hydrophobic | PE (5 nm) | | | | | | |

| | Chemical liquid | | | | | | | |
|---|---|---|---|---|---|---|---|---|
| | Organic solvent in purified chemical liquid | | Content of metal particles in purified chemical liquid (with respect to total mass of chemical liquid) | | | | | |
| | | Content (based on mass) | Total content (mass ppt) | Content of particles containing specific metal(mass ppt) | | | | |
| | Type | | | Fe | Al | Cr | Ni | Ti | Total |
| Example 43 | CyHe | Balance | 0.8 | 0.08 | 0.06 | 0.03 | 0.03 | 0.05 | 0.25 |
| Example 44 | CyHe | Balance | 0.5 | 0.05 | 0.04 | 0.02 | 0.02 | 0.03 | 0.16 |
| Example 45 | CyHe | Balance | 0.8 | 0.08 | 0.06 | 0.03 | 0.03 | 0.05 | 0.25 |
| Example 46 | CyHe | Balance | 0.8 | 0.08 | 0.06 | 0.03 | 0.03 | 0.05 | 0.25 |
| Example 47 | CyHe | Balance | 25 | 2.50 | 2.08 | 0.83 | 1.09 | 1.70 | 8.20 |
| Example 48 | CyHe | Balance | 38 | 3.80 | 3.17 | 1.27 | 1.65 | 2.59 | 12.48 |
| Example 49 | CyHe | Balance | 25 | 2.50 | 2.08 | 0.83 | 1.09 | 1.70 | 8.20 |
| Example 50 | CyHe | Balance | 38 | 3.80 | 3.17 | 1.27 | 1.65 | 2.59 | 12.48 |
| Comparative Example 1 | CyHe | Balance | 25 | 2.50 | 2.08 | 0.83 | 1.09 | 1.70 | 8.20 |
| Comparative Example 2 | CyHe | Balance | 38 | 3.80 | 3.17 | 1.27 | 1.65 | 2.59 | 12.48 |

| | Chemical liquid | | | | | | | Content of organic impurity in purified chemical liquid (mass ppm) | Evaluation Short occurrence inhibition performance |
|---|---|---|---|---|---|---|---|---|---|---|
| | Content of metal ions in purified chemical liquid (with respect to total mass of chemical liquid) | | | | | | | | |
| | Total content (mass ppt) | Content of particles containing specific metal (mass ppt) | | | | | | | |
| | | Fe | Al | Cr | Ni | Ti | Total | | |
| Example 43 | 2 | 0.20 | 0.17 | 0.07 | 0.09 | 0.14 | 0.67 | 0.3 | A |
| Example 44 | 2 | 0.20 | 0.17 | 0.07 | 0.09 | 0.14 | 0.67 | 0.2 | C |
| Example 45 | 3.0 | 0.30 | 0.25 | 0.10 | 0.13 | 0.20 | 0.98 | 0.3 | AA |
| Example 46 | 2.0 | 0.20 | 0.17 | 0.07 | 0.09 | 0.14 | 0.67 | 0.3 | AA |
| Example 47 | 32 | 3.20 | 2.67 | 1.07 | 1.39 | 2.18 | 10.51 | 31.0 | B |
| Example 48 | 45 | 4.50 | 3.75 | 1.50 | 1.96 | 3.07 | 14.78 | 49.0 | B |

TABLE 1-continued

| | | | | | | | | | |
|---|---|---|---|---|---|---|---|---|---|
| Example 49 | 32 | 3.20 | 2.67 | 1.07 | 1.39 | 2.18 | 10.51 | 31.0 | C |
| Example 50 | 45 | 4.50 | 3.75 | 1.50 | 1.96 | 3.07 | 14.78 | 49.0 | C |
| Comparative Example 1 | 32 | 3.20 | 2.67 | 1.07 | 1.39 | 2.18 | 10.51 | 31.0 | D |
| Comparative Example 2 | 45 | 4.50 | 3.75 | 1.50 | 1.96 | 3.07 | 14.78 | 49.0 | D |

In the tables, "Material" means the material component of the filter.

In Table 1, the manufacturing method of the chemical liquid, the properties of the chemical liquid, and the evaluation for the chemical liquid according to the examples and the comparative examples are described in each line as Table 1-1-1 to Table 1-1-10 or Table 1-2-1 to Table 1-2-10. That is, in the case of chemical liquid of Example 45, the washing condition for the filter was such that cyclohexanone (solubility parameter: 19.6 $(MPa)^{1/2}$) was used as a washing solution, the washing solution was caused to pass through each filter and circulated 10 times. This operation was regarded as 1 set, and the operation was repeated by 3 sets. Then, by using cyclohexanone as a test liquid, the test was performed by a predetermined method. According to the test results relating to the washed first filter, the content of the metal particles in the test liquid with respect to the total mass of the test liquid was 0.15 mass ppt for Fe-containing particles, 0.13 mass ppt for Al-containing particles, 0.05 mass ppt for Cr-containing particles, 0.07 mass ppt for Ni-containing particles, and 0.10 mass ppt for Ti-containing particles. The total content of these was 0.50 mass ppt, and the total content including other metal-containing particles (hereinafter, simply referred to as "total content of particles") was 1.5 mass ppt. The content of metal-containing ions in the test liquid with respect to the total mass of the test liquid was 0.30 mass ppt for Fe-containing ions, 0.25 mass ppt for Al-containing ions, 0.10 mass ppt for Cr-containing ions, 0.13 mass ppt for Ni-containing ions, and 0.20 mass ppt for Ti-containing ions. The total content of these was 0.98 mass ppt, and the total content including other metal-containing ions (hereinafter, simply referred to as "total content of ions") was 3.0 mass ppt. Furthermore, the content of the organic impurity in the test liquid was 0.50 mass ppm.

According to the test results relating to the washed second filter, the total content of metal particles in the test liquid with respect to the total mass of the test liquid was 0.15 mass ppt for Fe-containing particles, 0.13 mass ppt for Al-containing particles, 0.05 mass ppt for Cr-containing particles, 0.07 mass ppt for Ni-containing particles, and 0.10 mass ppt for Ti-containing particles. The total content of these was 0.50 mass ppt, and the total content of particles was 1.4 mass ppt. The content of metal-containing ions in the test liquid with respect to the total mass of the test liquid was 0.30 mass ppt for Fe-containing ions, 0.25 mass ppt for Al-containing ions, 0.10 mass ppt for Cr-containing ions, 0.13 mass ppt for Ni-containing ions, and 0.20 mass ppt for Ti-containing ions. The total content of these was 0.98 mass ppt, and the total content of ions was 2.9 mass ppt. Furthermore, the content of the organic impurity in the test liquid was 0.40 mass ppm.

According to the test results relating to the washed third filter, the total content of metal particles in the test liquid with respect to the total mass of the test liquid was 0.15 mass ppt for Fe-containing particles, 0.13 mass ppt for Al-containing particles, 0.05 mass ppt for Cr-containing particles, 0.07 mass ppt for Ni-containing particles, and 0.10 mass ppt for Ti-containing particles. The total content of these was 0.50 mass ppt, and the total content of particles was 1.4 mass ppt. The content of metal-containing ions in the test liquid with respect to the total mass of the test liquid was 0.30 mass ppt for Fe-containing ions, 0.25 mass ppt for Al-containing ions, 0.10 mass ppt for Cr-containing ions, 0.13 mass ppt for Ni-containing ions, and 0.20 mass ppt for Ti-containing ions. The total content of these was 0.98 mass ppt, and the total content of ions was 2.9 mass ppt. Furthermore, the content of the organic impurity in the test liquid was 0.32 mass ppm.

As the purification condition for the chemical liquid, IEX-PTFE (10 nm) carboxylic acid (hydrophilic) was used as the first filter, PTFE (10 nm) (hydrophilic) was used as the second filter, and Nylon (5 nm) (hydrophilic) was used as the third filter. The filtration differential pressure was 120 kPa from the first to second stages (from the first filter to the second filter), and was 110 kPa from the second to third stages (from the second filter to the third filter).

In the chemical liquid after washing, the content of the metal particles with respect to the total mass of the chemical liquid was 0.08 mass ppt for Fe-containing particles, 0.06 mass ppt for Al-containing particles, 0.03 mass ppt for Cr-containing particles, 0.03 mass ppt for Ni-containing particles, and 0.05 mass ppt for Ti-containing particles. The total content of these was 0.25 mass ppt, and the total content of particles was 0.8 mass ppt. The content of the metal-containing ions with respect to the total mass of the chemical liquid was 0.30 mass ppt for Fe-containing ions, 0.25 mass ppt for Al-containing ions, 0.10 mass ppt for Cr-containing ions, 0.13 mass ppt for Ni-containing ions, and 0.20 mass ppt for Ti-containing ions. The total content of these was 0.78 mass ppt, and the total content of ions was 3.0 mass ppt. The content of the organic impurity was 0.3 mass ppm, and the balance was cyclohexanone. The short occurrence inhibition performance of this chemical liquid was "AA".

For the examples and the comparative examples other than the above, the test results were described in the same manner in Table 1.

As is evident from the results described in Table 1, according to the chemical liquid purification method of each of the examples, a chemical liquid having the short occurrence inhibition performance which is the effect of the present invention could be obtained. In contrast, according to the chemical liquid purification method of each of the comparative examples, a chemical liquid having the effect of the present invention could not be obtained.

By the chemical liquid purification method of Example 45 satisfying the condition 4, it was possible to obtain a chemical liquid having a further improved effect of the present invention compared to the chemical liquid obtained by the chemical liquid purification method of Example 44.

By the chemical liquid purification method of Example 45 in which the content of the organic impurity in the test liquid was equal to or smaller than 10 mass ppm, it was possible to obtain a chemical liquid having a further improved effect of the present invention compared to the chemical liquid obtained by the purification method of Example 47.

By the chemical liquid purification method of Example 45 in which cyclohexanone was used as a washing solution, it was possible to obtain a chemical liquid having a further improved effect of the present invention compared to the chemical liquid obtained by the chemical liquid purification methods of Examples 33 and 34.

By the chemical liquid purification method of Example 45 in which the chemical liquid was purified through two or more sheets of filters, it was possible to obtain a chemical liquid having a further improved effect of the present invention compared to the chemical liquid obtained by the chemical liquid purification method of Example 1.

By the chemical liquid purification method of Example 45 in which a hydrophilic filter was used as the last filter through which the chemical liquid passed, it was possible to obtain a chemical liquid having a further improved effect of the present invention compared to the chemical liquid obtained by the chemical liquid purification method of Example 43.

By the chemical liquid purification method of Example 45 in which the filtration differential pressure was equal to or lower than 250 kPa, it was possible to obtain a chemical liquid having a further improved effect of the present invention compared to the chemical liquid obtained by the chemical liquid purification method of Example 18.

EXPLANATION OF REFERENCES 10, 20, 30: chemical liquid manufacturing device
11: tank
12: filling device
13: pipe line
14: filtering device
15: pump
16, 22, 33, 35: valve
21: circulation pipe line
31: distillation column
32: distillation pipe line
34: distillation column circulating pipe line
36: raw material injection pipe line

What is claimed is:

1. A chemical liquid purification method comprising:
a purification step of filtering a liquid to be purified containing an organic solvent by using a filter,
wherein a filter satisfying a condition 1 or a condition 2 in a following test is used as the filter,
test: 1,500 ml of a test liquid formed of the organic solvent is brought into contact with the filter for 24 hours under a condition of 23° C., and a content of particles containing at least one kind of metal selected from the group consisting of Fe, Al, Cr, Ni, and Ti in the test liquid after the contact satisfies the condition 1 or the condition 2,
condition 1: in a case where the test liquid contains one kind of particles containing at least one kind of metal selected from the group consisting of Fe, Al, Cr, Ni, and Ti, a content of one kind of the particles in the test liquid is equal to or smaller than 5.0 mass ppm, in a case where the test liquid after the contact contains one kind of ions containing at least one kind of metal selected from the group consisting of Fe, Al, Cr, Ni, and Ti, a content of one kind of the ions in the test liquid is equal to or smaller than 10 mass ppb, and
in a case where the test liquid after the contact contains two or more kinds of ions containing at least one kind of metal selected from the group consisting of Fe, Al, Cr, Ni, and Ti, a total content of two or more kinds of the ions in the test liquid is equal to or smaller than 10 mass ppb,
condition 2: in a case where the test liquid contains two or more kinds of particles containing at least one kind of metal selected from the group consisting of Fe, Al, Cr, Ni, and Ti, a total content of two or more kinds of the particles in the test liquid is equal to or smaller than 5.0 mass ppm, wherein in a case where the test liquid after the contact contains one kind of ions containing at least one kind of metal selected from the group consisting of Fe, Al, Cr, Ni, and Ti, a content of one kind of the ions in the test liquid is equal to or smaller than 10 mass ppb, and
in a case where the test liquid after the contact contains two or more kinds of ions containing at least one kind of metal selected from the group consisting of Fe, Al, Cr, Ni, and Ti, a total content of two or more kinds of the ions in the test liquid is equal to or smaller than 10 mass ppb.

2. The chemical liquid purification method according to claim 1,
wherein in a case where the test liquid after the contact contains an organic impurity, a content of the organic impurity in the test liquid is equal to or smaller than 10 mass ppm.

3. The chemical liquid purification method according to claim 2,
wherein the organic impurity contains at least one kind of compound selected from the group consisting of Formulae (1) to (7),

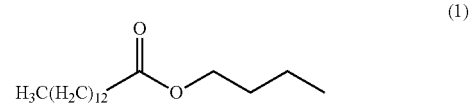

(1)

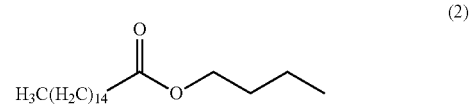

(2)

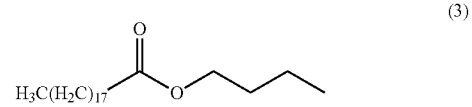

(3)

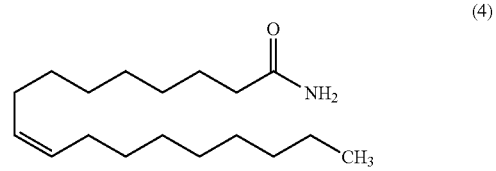

(4)

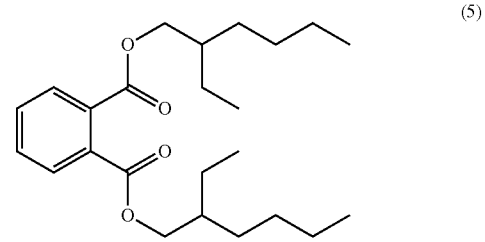

(5)

-continued

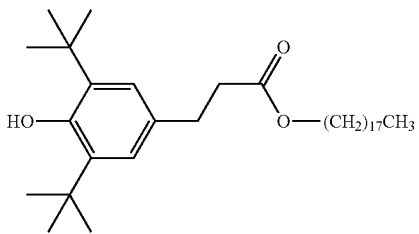
(6)

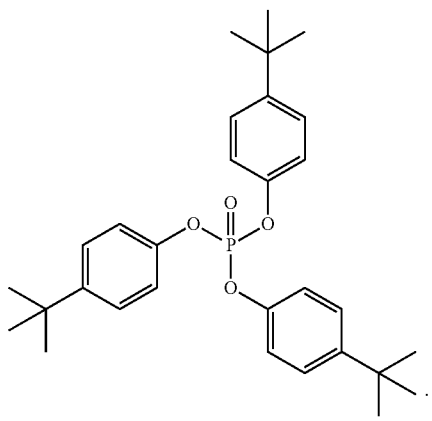
(7)

4. The chemical liquid purification method according to claim 1, further comprising:
a step of washing the filter by using a washing solution before the purification step,
wherein a solubility parameter of the washing solution is higher than 16 $(MPa)^{1/2}$.

5. The chemical liquid purification method according to claim 4,
wherein the washing solution is at least one kind of compound selected from the group consisting of dimethyl sulfoxide, n-methyl pyrrolidone, diethylene glycol, ethylene glycol, dipropylene glycol, propylene glycol, ethylene carbonate, propylene carbonate, sulfolane, cyclohexane, cyclohexanone, cycloheptanone, cyclopentanone, 2-heptanone, and (-butyrolactone.

6. The chemical liquid purification method according to claim 1,
wherein the filter is formed of at least one kind of material component selected from the group consisting of nylon, polyethylene, polypropylene, polyfluorocarbon, cellulose, diatomite, polystyrene, and glass.

7. The chemical liquid purification method according to claim 1,
wherein the filter comprises a plurality of filters, the purification step is a step of filtering the liquid to be purified by passing the liquid to be purified through at least two sheets of the plurality of filters.

8. The chemical liquid purification method according to claim 7,
wherein the plurality of filters include at least a hydrophobic filter and a hydrophilic filter.

9. The chemical liquid purification method according to claim 8,
wherein a last filter through which the liquid to be purified passes in the purification step is the hydrophilic filter.

10. The chemical liquid purification method according to claim 7,
wherein a filtration differential pressure at the time of filtering the liquid to be purified is equal to or lower than 250 kPa.

11. The chemical liquid purification method according to claim 1,
wherein the organic solvent is at least one kind of compound selected from the group consisting of propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, (-butyrolactone, diisoamyl ether, butyl acetate, isoamyl acetate, isopropanol, and 4-methyl-2-pentanol.

12. The chemical liquid purification method according to claim 1,
wherein in a case where the test liquid after the contact contains an organic impurity, a content of the organic impurity in the test liquid is equal to or smaller than 10 mass ppb.

13. The chemical liquid purification method according to claim 1, further comprising:
a step of washing the filter by using a washing solution before the purification step,
wherein a solubility parameter of the washing solution is higher than 16 $(MPa)^{1/2}$.

14. The chemical liquid purification method according to claim 2, further comprising:
a step of washing the filter by using a washing solution before the purification step,
wherein a solubility parameter of the washing solution is higher than 16 $(MPa)^{1/2}$.

15. The chemical liquid purification method according to claim 3, further comprising:
a step of washing the filter by using a washing solution before the purification step,
wherein a solubility parameter of the washing solution is higher than 16 $(MPa)^{1/2}$.

16. The chemical liquid purification method according to claim 1,
wherein the filter is formed of at least one kind of material component selected from the group consisting of nylon, polyethylene, polypropylene, polyfluorocarbon, cellulose, diatomite, polystyrene, and glass.

17. A chemical liquid purification method comprising:
a purification step of filtering a liquid to be purified containing an organic solvent by using a hydrophobic filter,
wherein a filter satisfying a condition 1 or a condition 2 in a following test is used as the hydrophobic filter,
test: 1,500 ml of a test liquid formed of the organic solvent is brought into contact with the hydrophobic filter for 24 hours under a condition of 23° C., and a content of particles containing at least one kind of metal selected from the group consisting of Fe, Al, Cr, Ni, and Ti in the test liquid after the contact satisfies the condition 1 or the condition 2,
condition 1: in a case where the test liquid contains one kind of particles containing at least one kind of metal selected from the group consisting of Fe, Al, Cr, Ni, and Ti, a content of one kind of the particles in the test liquid is equal to or smaller than 5.0 mass ppm, in a case where the test liquid contains one kind of ions containing at least one kind of metal selected from the group consisting of Fe, Al, Cr, Ni, and Ti, a content of one kind of the ions in the test liquid is equal to or smaller than 10 mass ppb, and in a case where the test liquid after the contact contains two or more kinds of ions containing at least one kind of metal selected from the group consisting of Fe, Al, Cr, Ni, and Ti, a total content of two or more kinds of the ions in the test liquid is equal to or smaller than 10 mass ppb, condition 2: in a case where the test liquid contains two or more kinds of particles containing at least one kind of metal selected from the group consisting of Fe, Al, Cr, Ni, and Ti, a total content of two or more kinds of the particles in the test liquid is equal to or smaller than 5.0 mass ppm, wherein in a case where the test liquid after the contact contains one kind of ions containing at least one kind of metal selected from the group consisting of Fe, Al, Cr, Ni, and Ti, a content of one kind of the ions in the test liquid is equal to or smaller than 10 mass ppb, and in a case where the test liquid after the contact contains two or more kinds of ions containing at least one kind of metal selected from the group consisting of Fe, Al, Cr, Ni, and Ti, a total content of two or more kinds of the ions in the test liquid is equal to or smaller than 10 mass ppb.

18. A chemical liquid purification method comprising:
a purification step of filtering a liquid to be purified containing an organic solvent by using a filter formed of at least one kind of material component selected from the group consisting of nylon, polyfluorocarbon, cellulose, diatomite, polystyrene, and glass,
wherein a filter satisfying a condition 1 or a condition 2 in a following test is used as the filter,
test: 1,500 ml of a test liquid formed of the organic solvent is brought into contact with the filter for 24 hours under a condition of 23° C., and a content of particles containing at least one kind of metal selected from the group consisting of Fe, Al, Cr, Ni, and Ti in the test liquid after the contact satisfies the condition 1 or the condition 2,
condition 1: in a case where the test liquid contains one kind of particles containing at least one kind of metal selected from the group consisting of Fe, Al, Cr, Ni, and Ti, a content of one kind of the particles in the test liquid is equal to or smaller than 5.0 mass ppm, wherein in a case where the test liquid after the contact contains an organic impurity, a content of the organic impurity in the test liquid is equal to or smaller than 10 mass ppm, the organic impurity contains at least one kind of compound selected from the group consisting of Formulae (1) to (7),

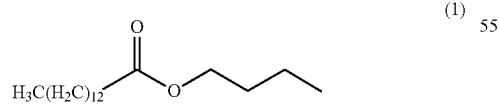
(1)

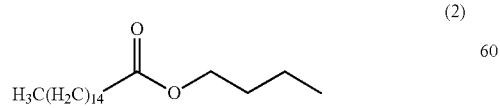
(2)

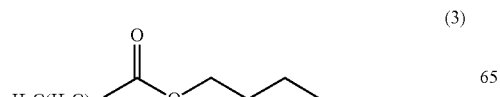
(3)

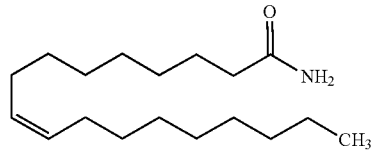
(4)

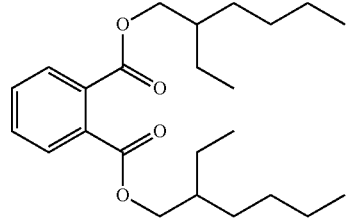
(5)

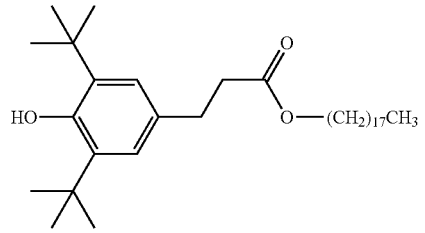
(6)

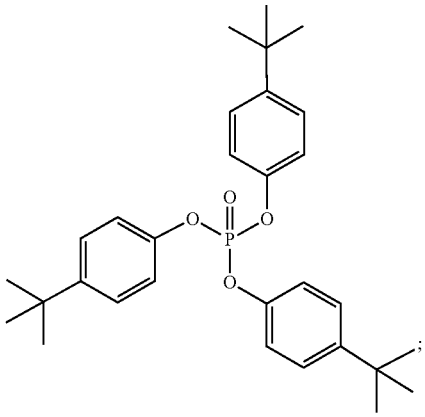
(7)

condition 2: in a case where the test liquid contains two or more kinds of particles containing at least one kind of metal selected from the group consisting of Fe, Al, Cr, Ni, and Ti, a total content of two or more kinds of the particles in the test liquid is equal to or smaller than 5.0 mass ppm, wherein in a case where the test liquid after the contact contains an organic impurity, a content of the organic impurity in the test liquid is equal to or smaller than 10 mass ppm, the organic impurity contains at least one kind of compound selected from the group consisting of Formulae (1) to (7),

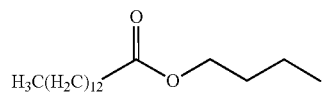
(1)

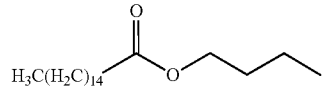
(2)

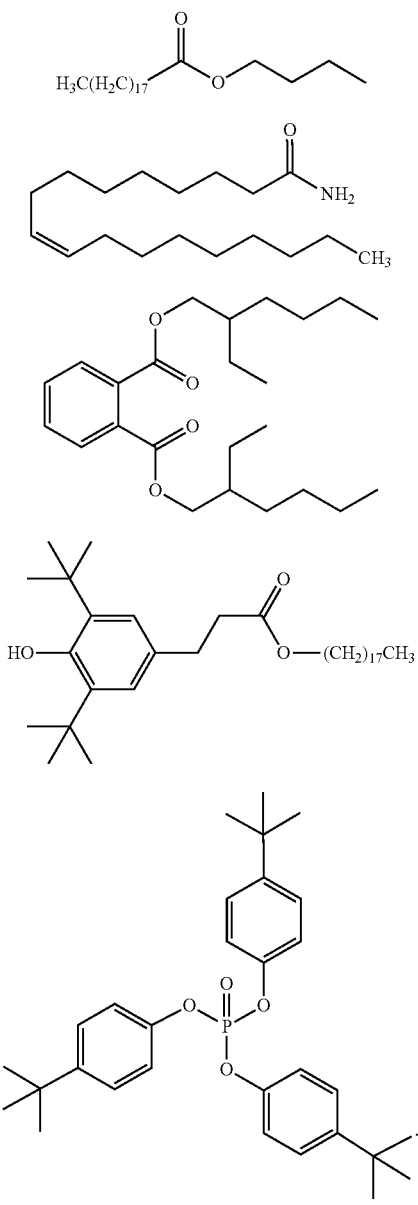

19. A chemical liquid purification method comprising:

a purification step of filtering a liquid to be purified containing an organic solvent by using a filter, wherein a filter satisfying a condition 1 or a condition 2 in a following test is used as the filter, test: 1,500 ml of a test liquid formed of the organic solvent is brought into contact with the filter for 24 hours under a condition of 23° C., and a content of particles containing at least one kind of metal selected from the group consisting of Fe, Al, Cr, Ni, and Ti in the test liquid after the contact satisfies the condition 1 or the condition 2, condition 1: in a case where the test liquid contains one kind of particles containing at least one kind of metal selected from the group consisting of Fe, Al, Cr, Ni, and Ti, a content of one kind of the particles in the test liquid is equal to or smaller than 2.45 mass ppt, in a case where the test liquid after the contact contains one kind of ions containing at least one kind of metal selected from the group consisting of Fe, Al, Cr, Ni, and Ti, a content of one kind of the ions in the test liquid is equal to or smaller than 10 mass ppb, and in a case where the test liquid after the contact contains two or more kinds of ions containing at least one kind of metal selected from the group consisting of Fe, Al, Cr, Ni, and Ti, a total content of two or more kinds of the ions in the test liquid is equal to or smaller than 10 mass ppb, condition 2: in a case where the test liquid contains two or more kinds of particles containing at least one kind of metal selected from the group consisting of Fe, Al, Cr, Ni, and Ti, a total content of two or more kinds of the particles in the test liquid is equal to or smaller than 2.45 mass ppt, wherein in a case where the test liquid after the contact contains one kind of ions containing at least one kind of metal selected from the group consisting of Fe, Al, Cr, Ni, and Ti, a content of one kind of the ions in the test liquid is equal to or smaller than 10 mass ppb, and in a case where the test liquid after the contact contains two or more kinds of ions containing at least one kind of metal selected from the group consisting of Fe, Al, Cr, Ni, and Ti, a total content of two or more kinds of the ions in the test liquid is equal to or smaller than 10 mass ppb.

* * * * *